United States Patent
Uo et al.

(10) Patent No.: US 12,348,342 B2
(45) Date of Patent: Jul. 1, 2025

(54) COMMUNICATION DEVICE

(71) Applicants: Kabushiki Kaisha Toshiba, Tokyo (JP); Toshiba Electronic Devices & Storage Corporation, Tokyo (JP)

(72) Inventors: Toyoaki Uo, Kanagawa (JP); Hiroaki Shimizu, Tokyo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 12 days.

(21) Appl. No.: 18/462,359

(22) Filed: Sep. 6, 2023

(65) Prior Publication Data

US 2024/0146588 A1    May 2, 2024

(30) Foreign Application Priority Data

Oct. 31, 2022 (JP) .................... 2022-174700

(51) Int. Cl.
| | |
|---|---|
| *H04L 27/04* | (2006.01) |
| *H03K 5/01* | (2006.01) |
| *H03K 19/20* | (2006.01) |
| *H04B 1/40* | (2015.01) |
| *H03K 5/00* | (2006.01) |

(52) U.S. Cl.
CPC .............. *H04L 27/04* (2013.01); *H03K 5/01* (2013.01); *H03K 19/20* (2013.01); *H04B 1/40* (2013.01); *H03K 2005/00078* (2013.01)

(58) Field of Classification Search
CPC ............ H03K 19/20; H03K 5/01; H03K 7/08; H03K 2005/00078; H04L 27/04; H04L 27/06; H04B 1/40
See application file for complete search history.

(56) References Cited

U.S. PATENT DOCUMENTS

| | | |
|---|---|---|
| 5,952,849 A | 9/1999 | Haigh |
| 6,262,600 B1 | 7/2001 | Haigh et al. |
| 9,660,848 B2 | 5/2017 | Yun et al. |
| 10,270,630 B2 | 4/2019 | Yun et al. |
| 10,382,035 B2 | 8/2019 | Yanagishima et al. |
| 10,917,139 B2 | 2/2021 | Uo et al. |
| 11,451,254 B2 | 9/2022 | Uo |

(Continued)

FOREIGN PATENT DOCUMENTS

| | | |
|---|---|---|
| JP | 2011-146934 A | 7/2011 |
| JP | 2016-181898 A | 10/2016 |

(Continued)

*Primary Examiner* — Dac V Ha
(74) *Attorney, Agent, or Firm* — Kim & Stewart LLP

(57) ABSTRACT

According to one embodiment, a communication device includes first and second substrates. The first substrate includes an input circuit and a modulation circuit. The second substrate includes a receive circuit and an output circuit. The modulation circuit includes at least one delay circuit, outputs a modulated signal if an input signal has a first logic level, and using the at least one delay circuit, adjusts a length of a period to output the modulated signal shorter or longer than a period when the input signal has the first logic level. The receive circuit receives an electrical signal based on the modulated signal and demodulates the electrical signal. The output circuit outputs an output signal based on the electrical signal demodulated by the receive circuit.

12 Claims, 22 Drawing Sheets

(56) References Cited

U.S. PATENT DOCUMENTS

| | | | |
|---|---|---|---|
| 11,671,138 B2* | 6/2023 | Manikandan | H04B 1/44 |
| | | | 375/296 |
| 12,057,838 B2* | 8/2024 | Chen | H03K 19/20 |
| 2023/0308323 A1* | 9/2023 | Shrivastava | H03C 1/36 |
| 2024/0372572 A1* | 11/2024 | Cavalotto | H04L 25/4902 |

FOREIGN PATENT DOCUMENTS

| | | |
|---|---|---|
| JP | 2020-043432 A | 3/2020 |
| JP | 2022-015529 A | 1/2022 |

\* cited by examiner

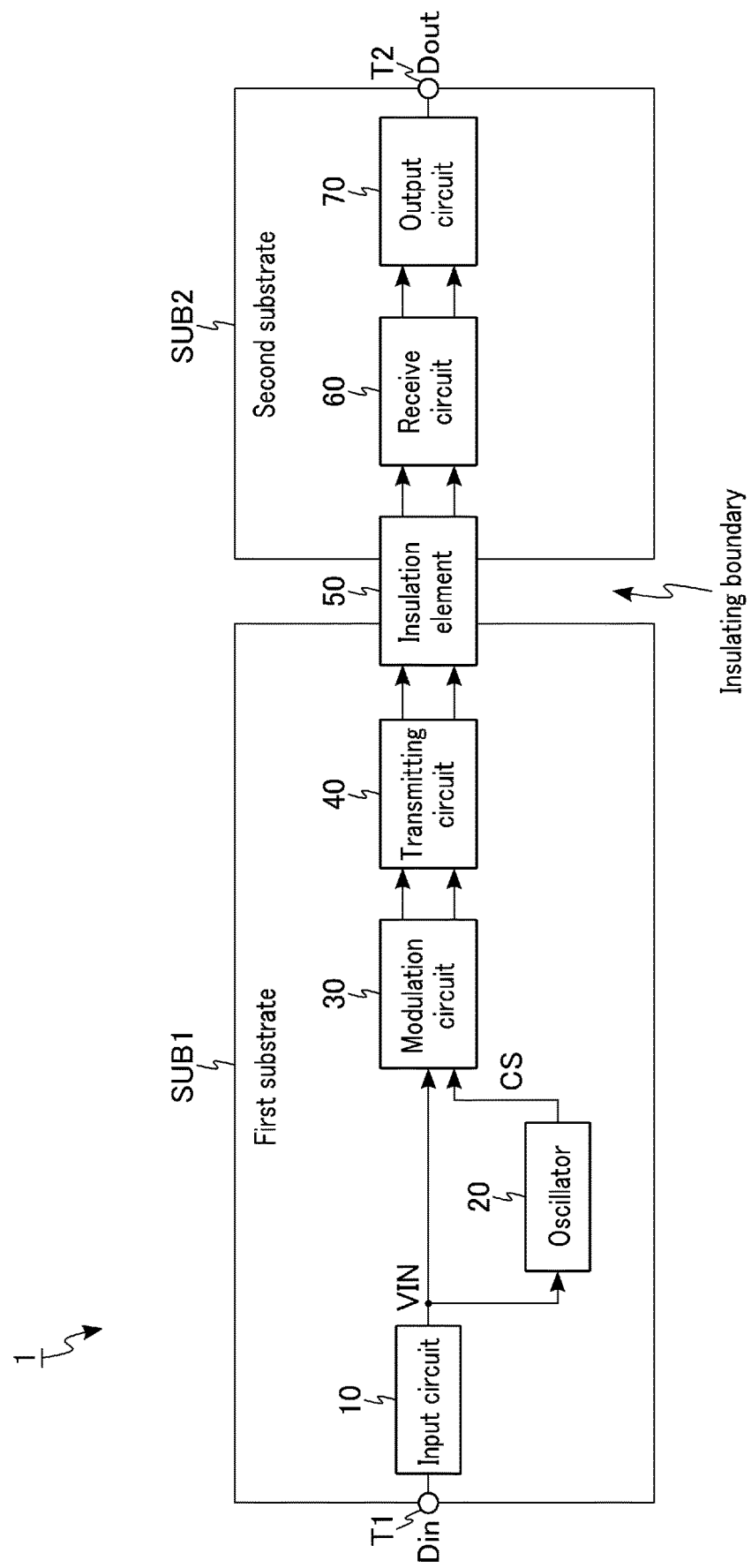
F I G. 1

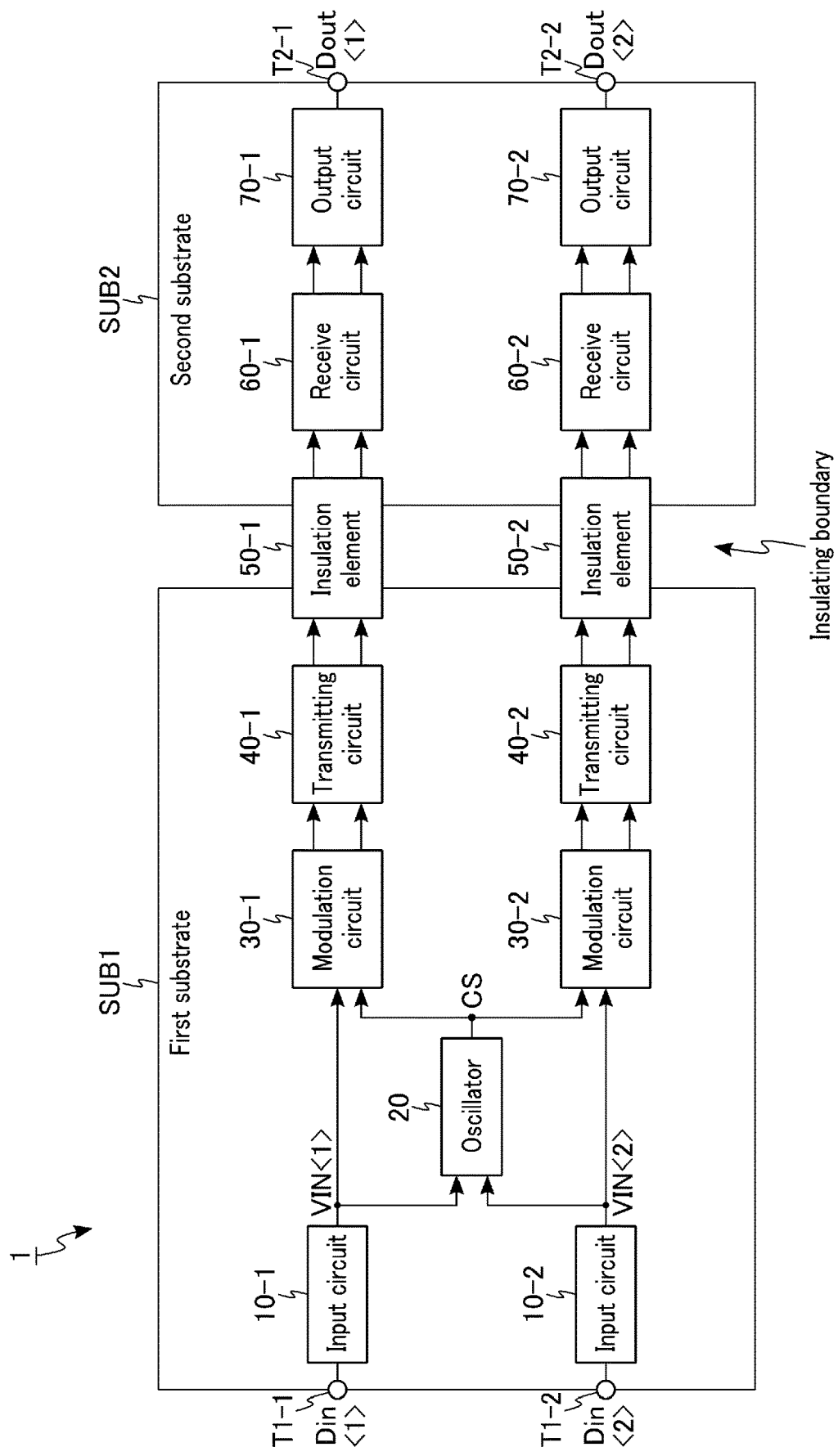
F I G. 2

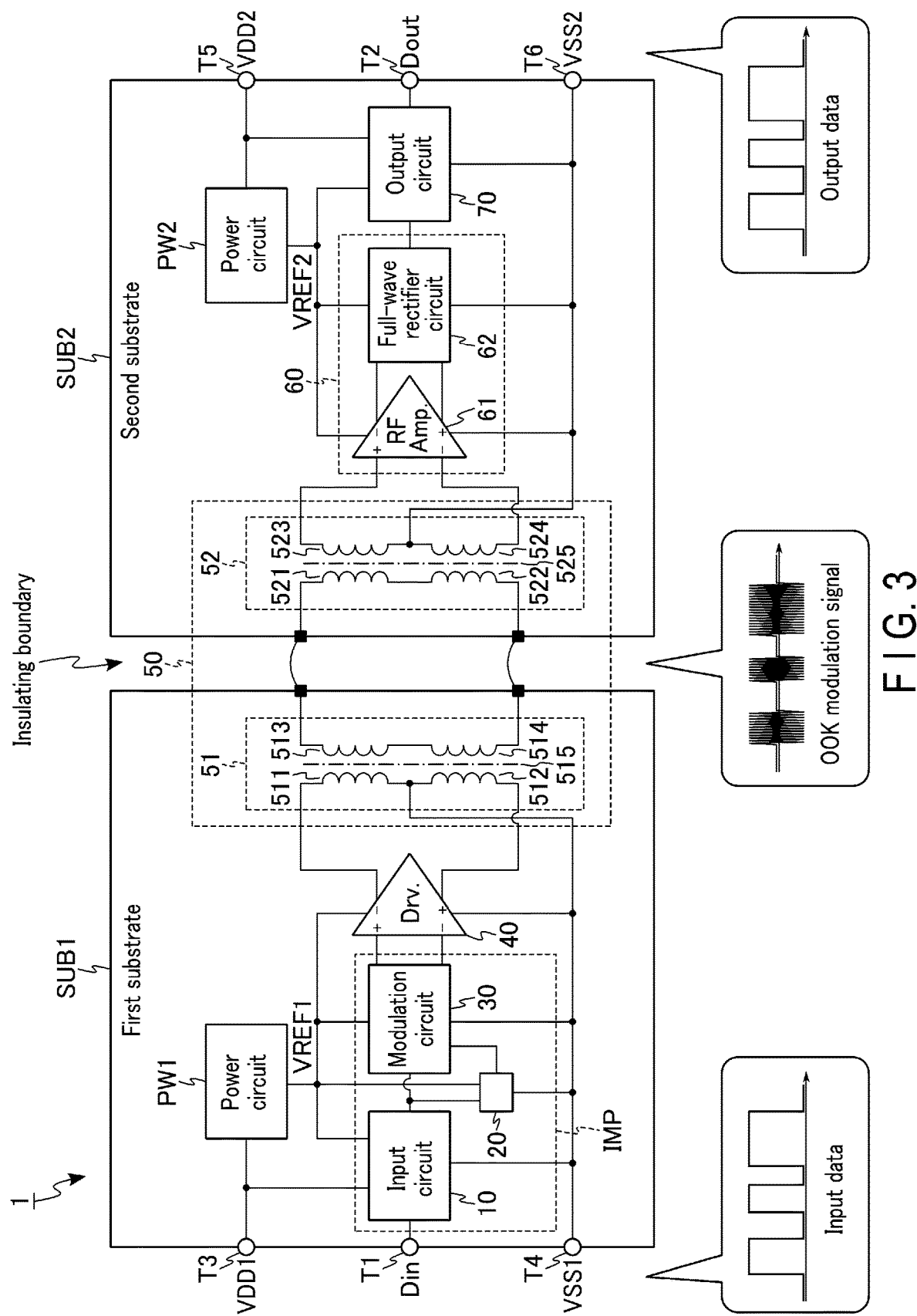
F I G. 3

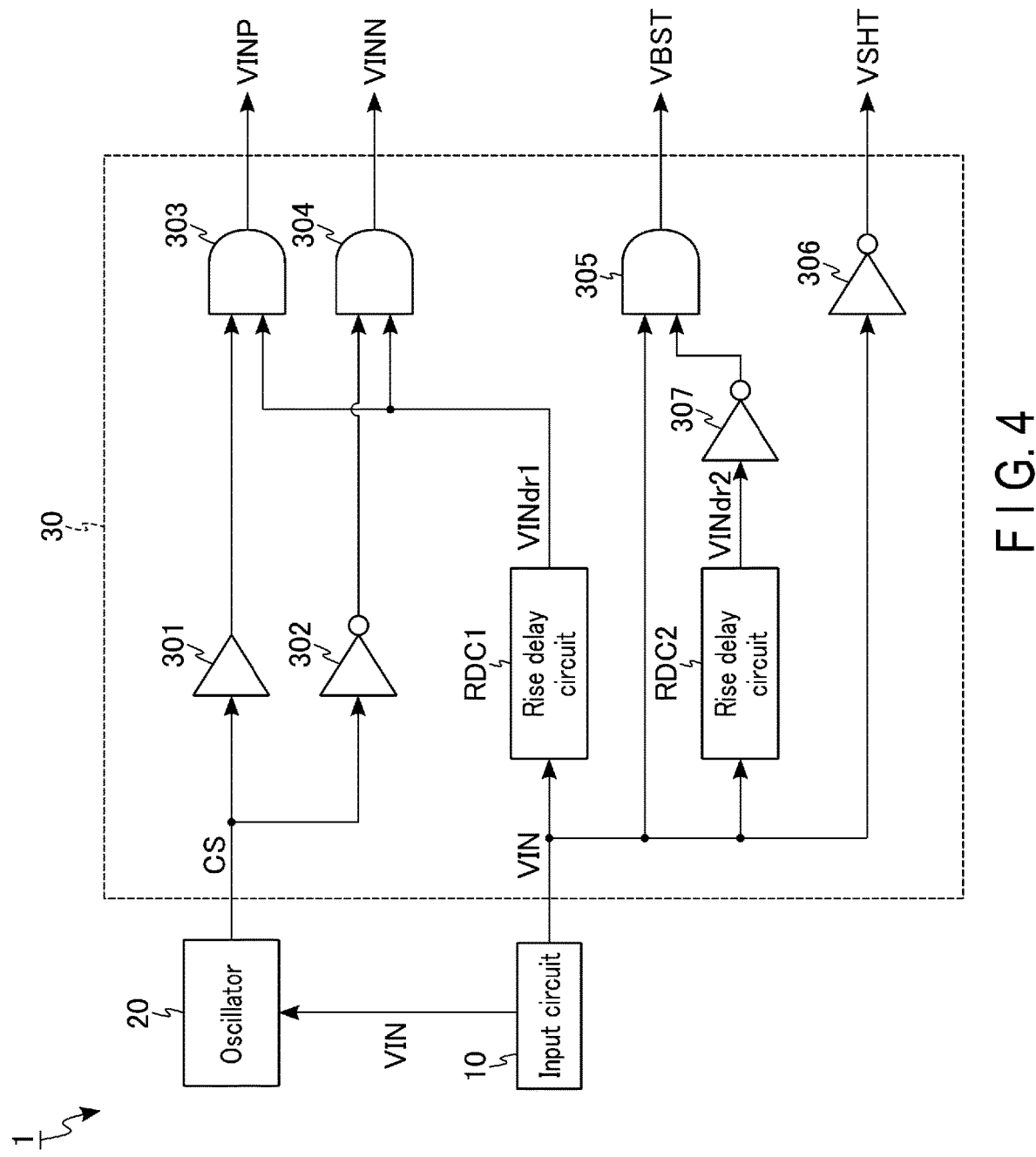
F I G. 4

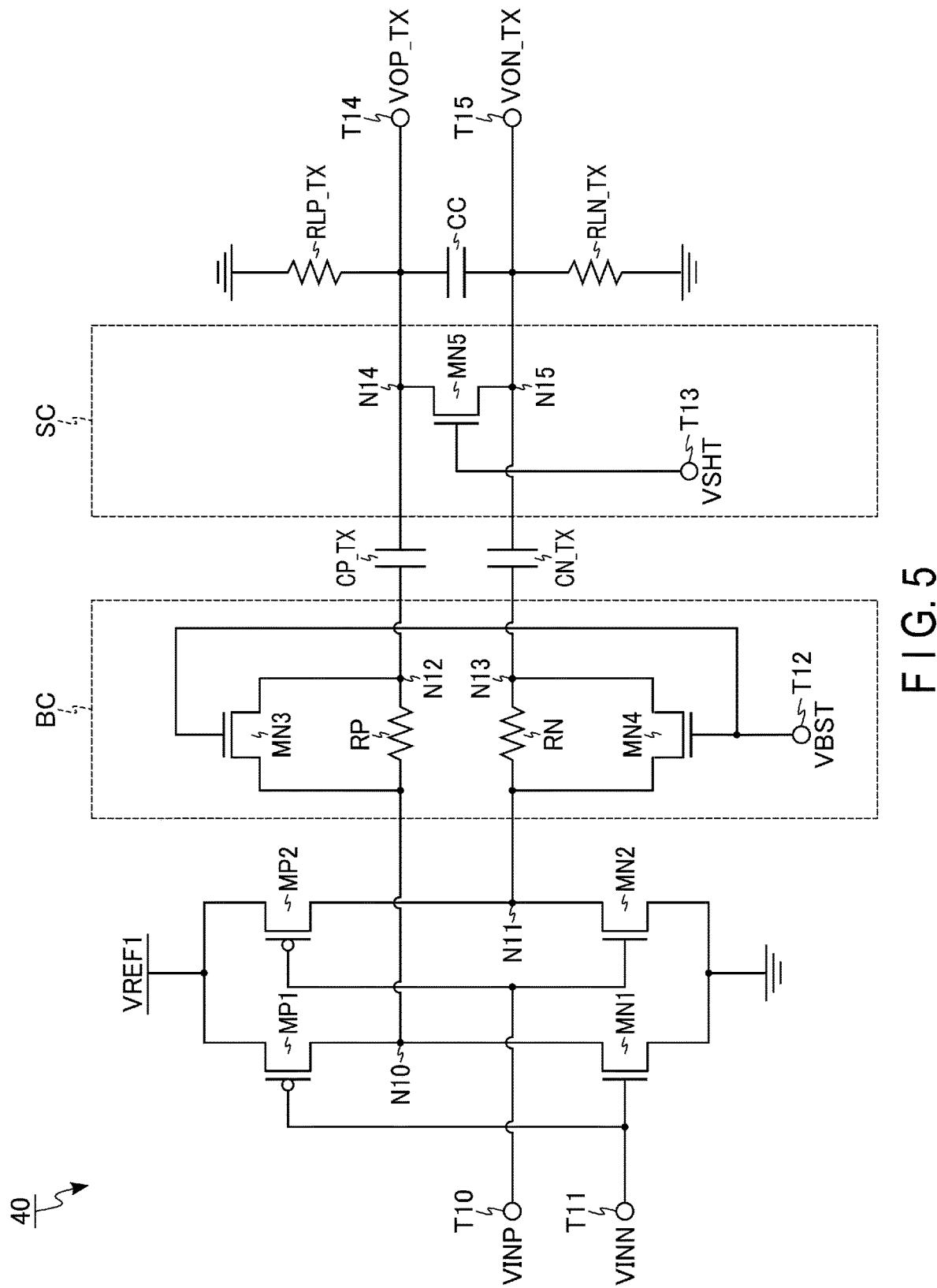
F I G. 5

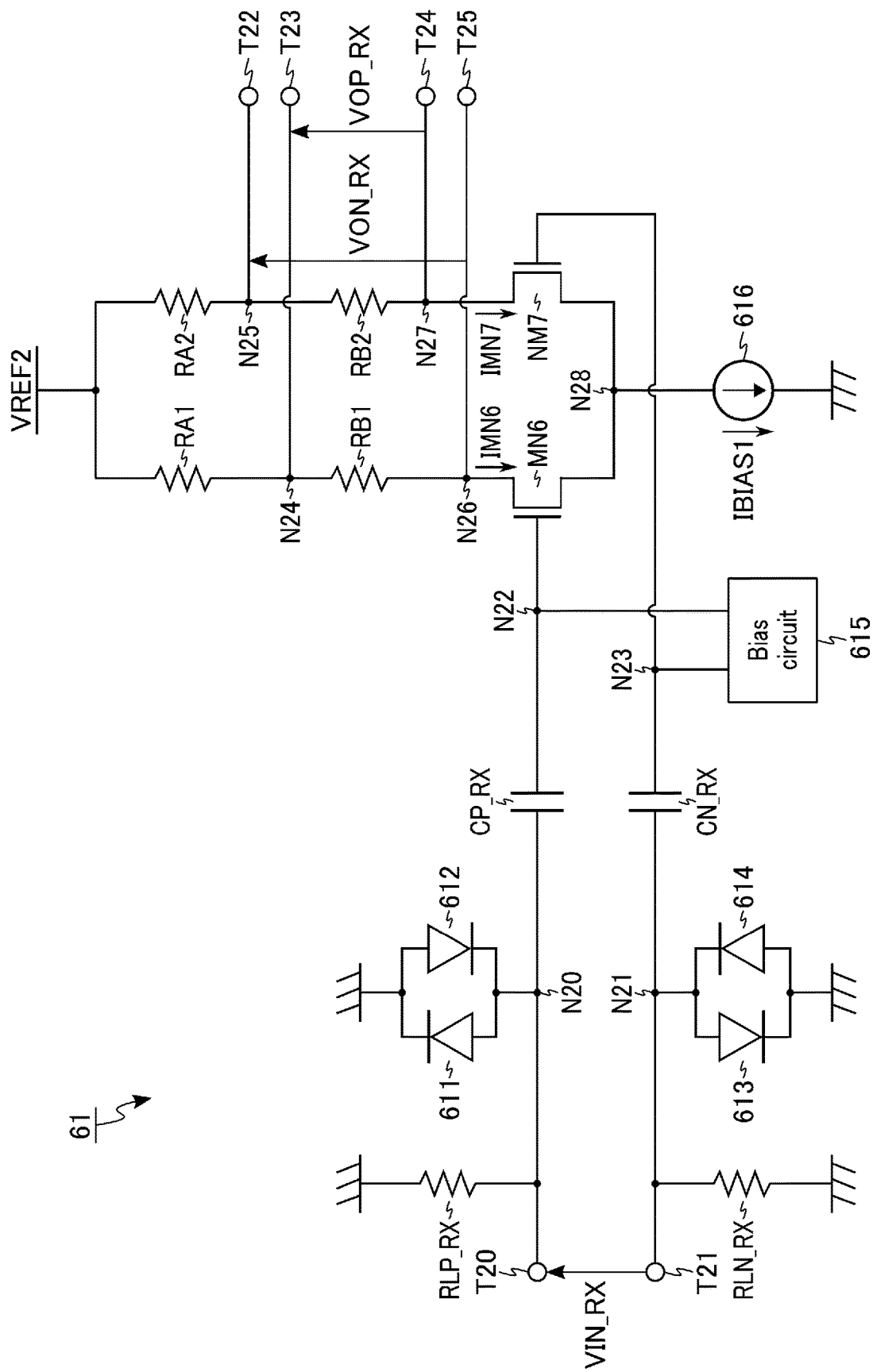
F I G. 6

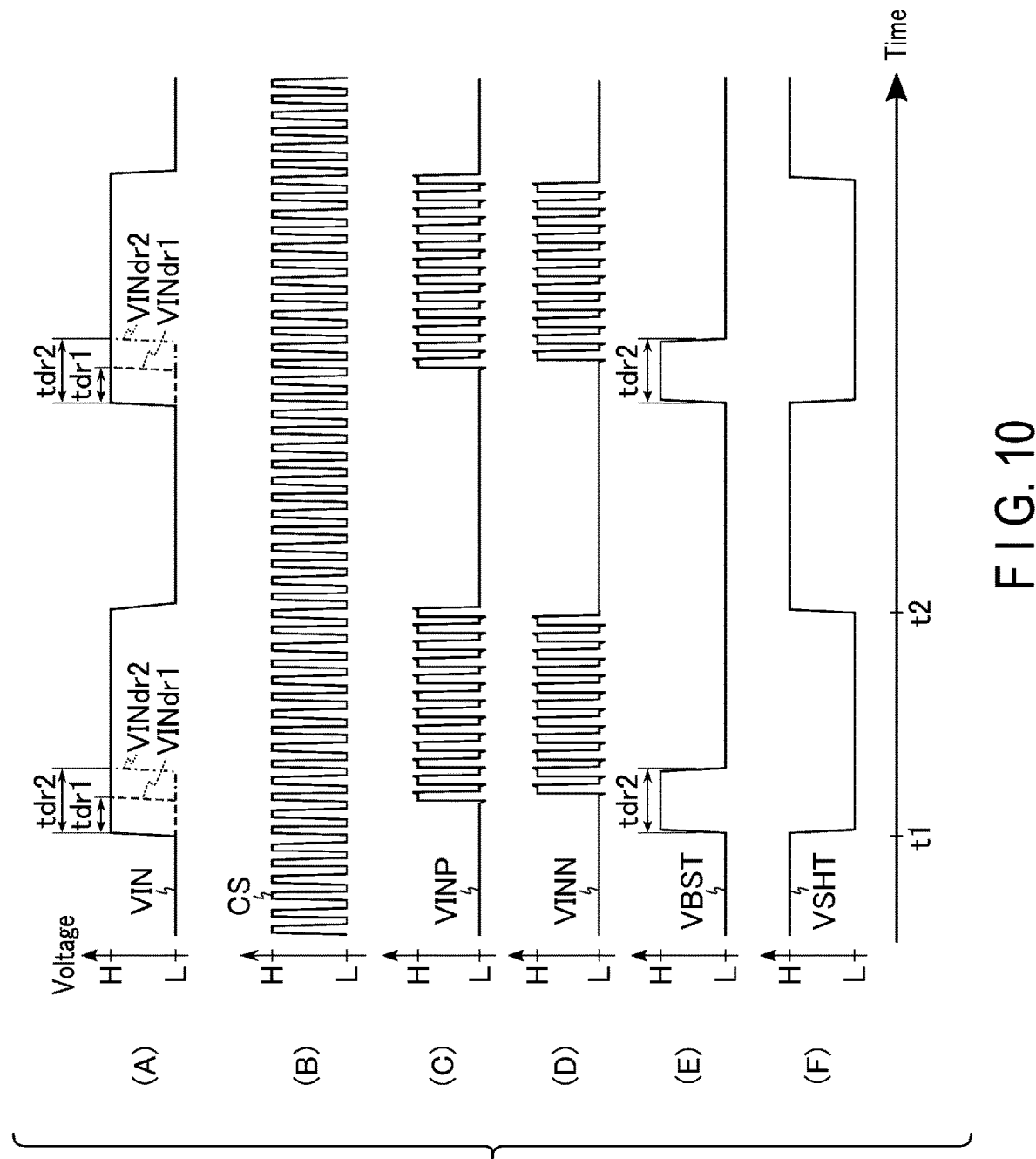
F I G. 10

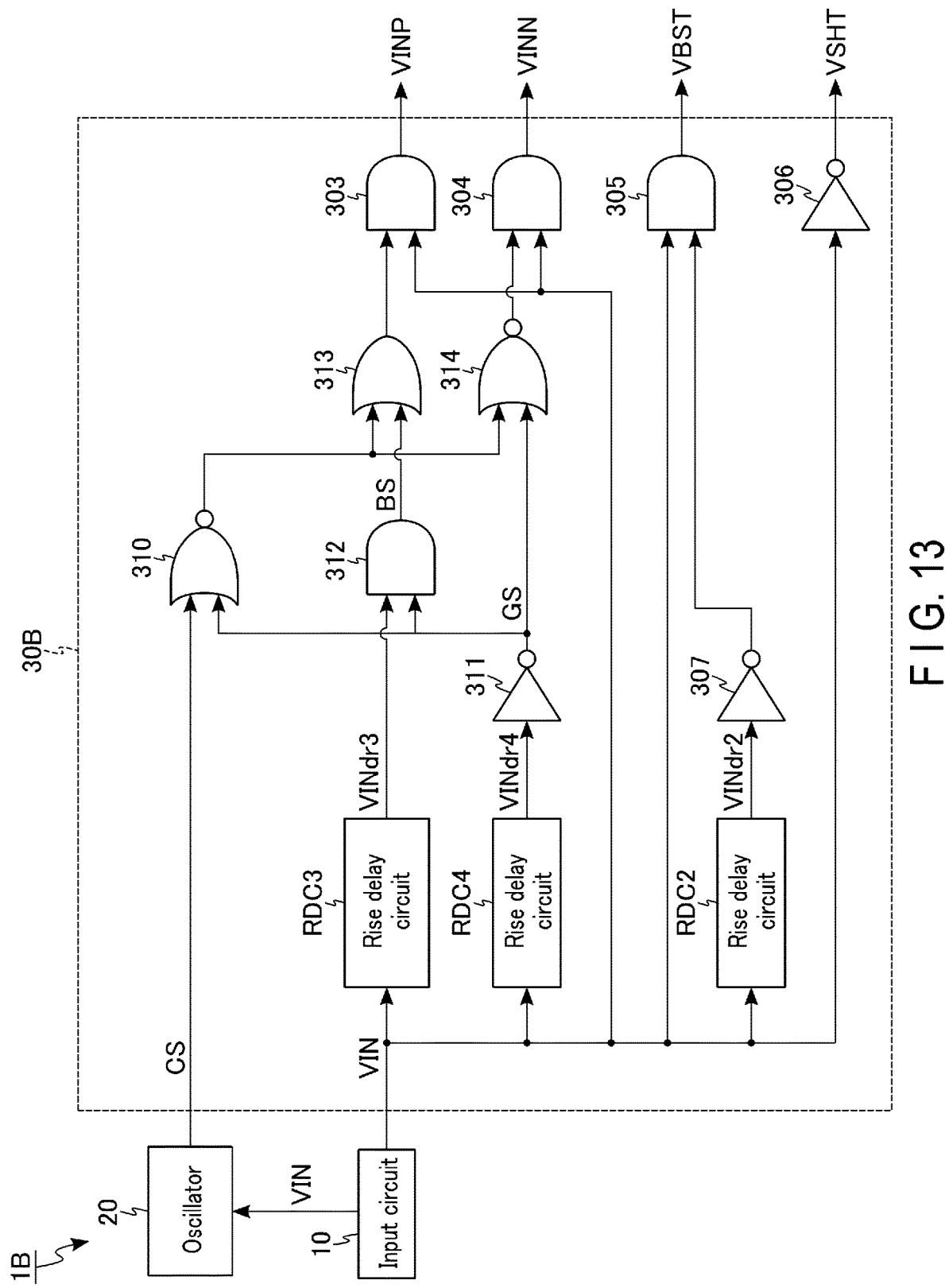
F I G. 13

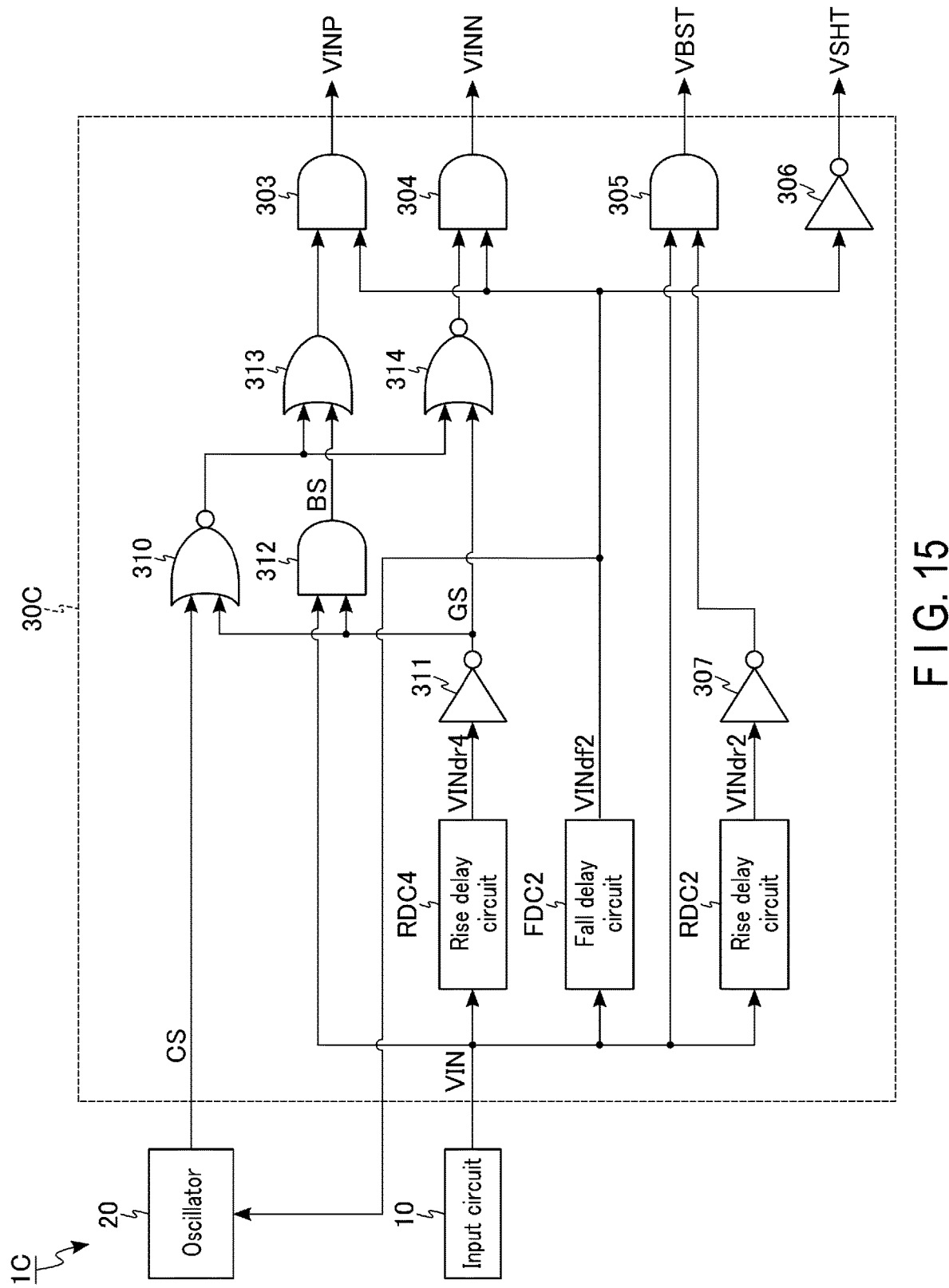
F I G. 15

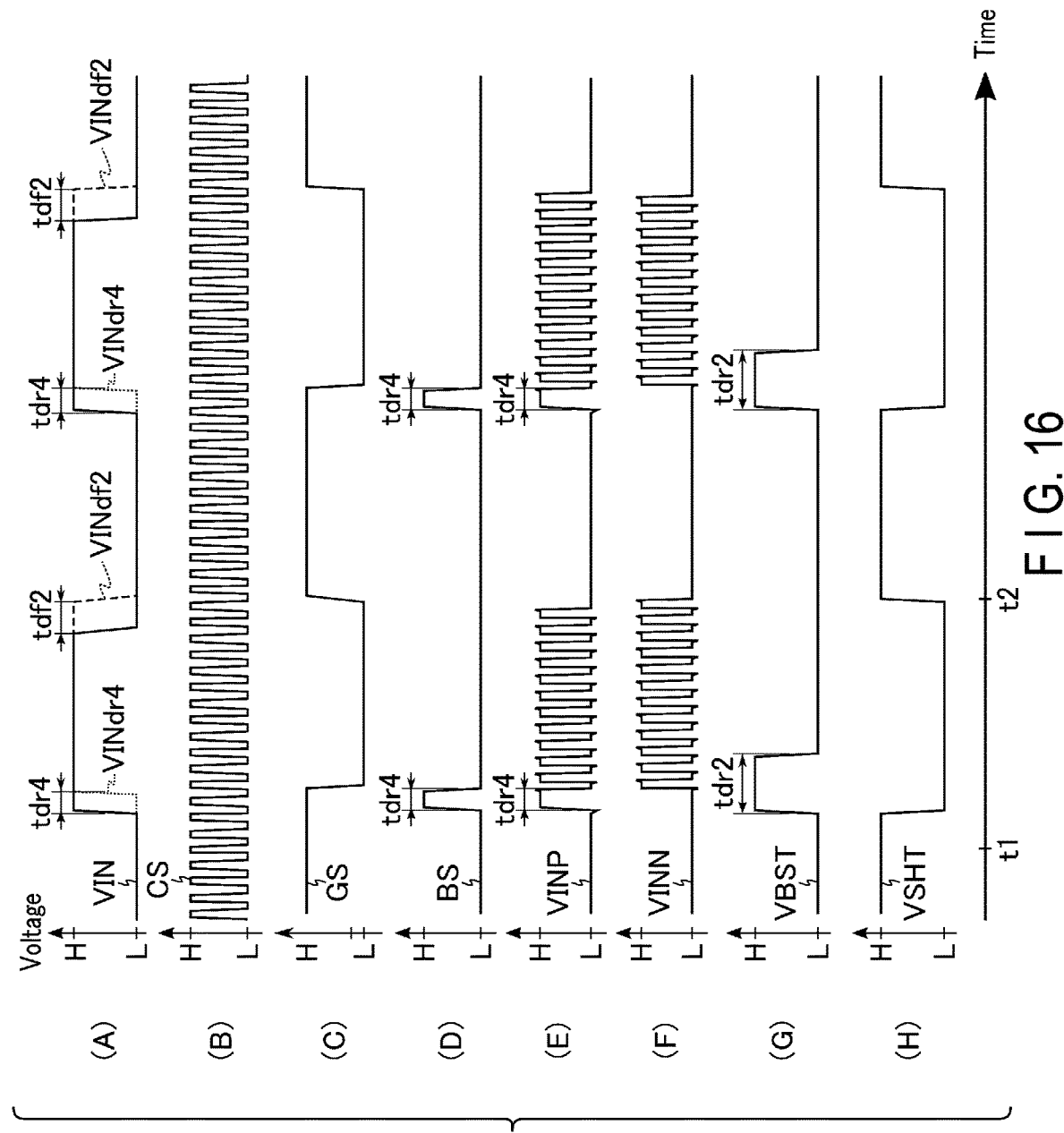
F I G. 16

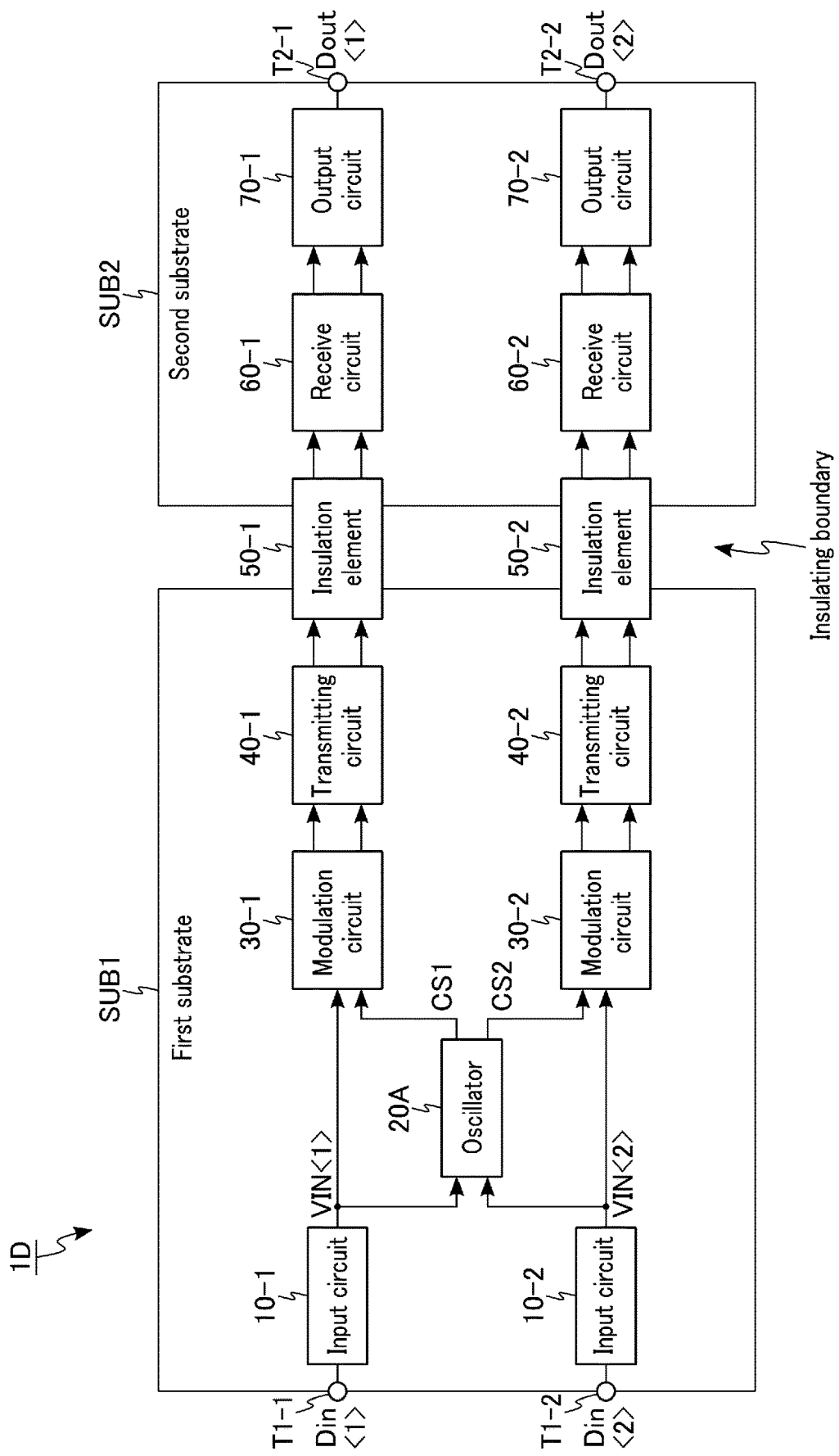
F I G. 17

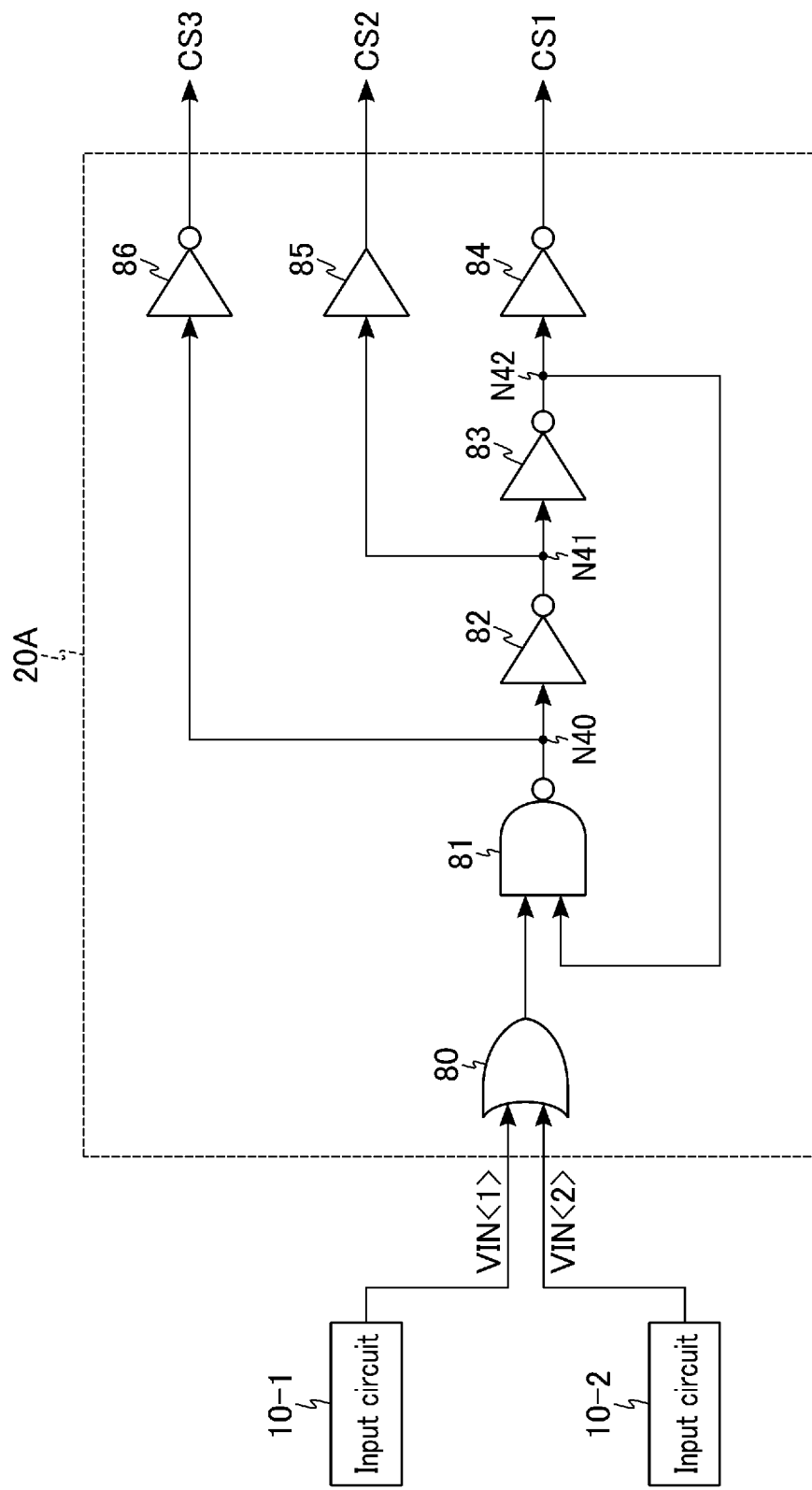
F I G. 18

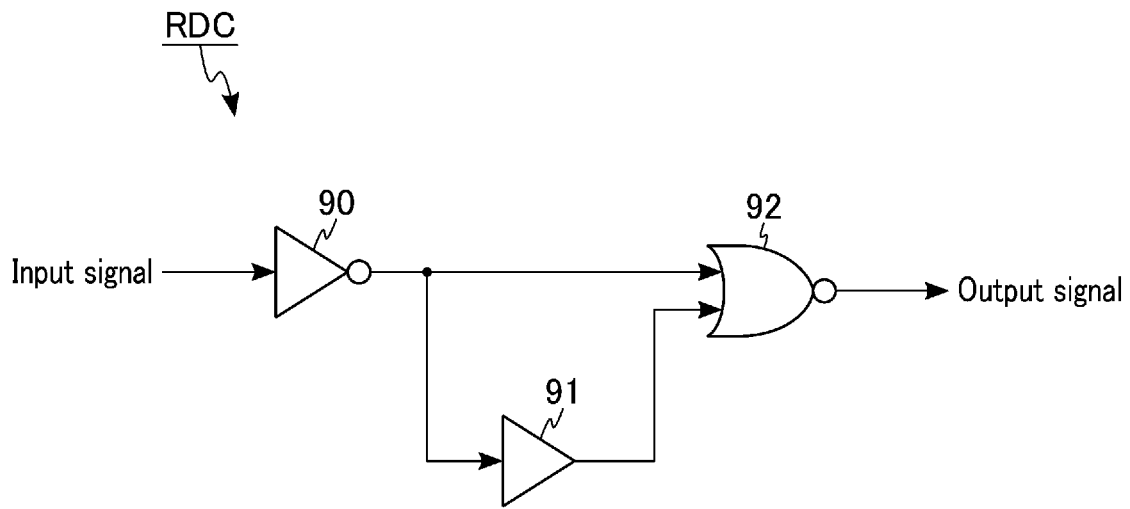
F I G. 19
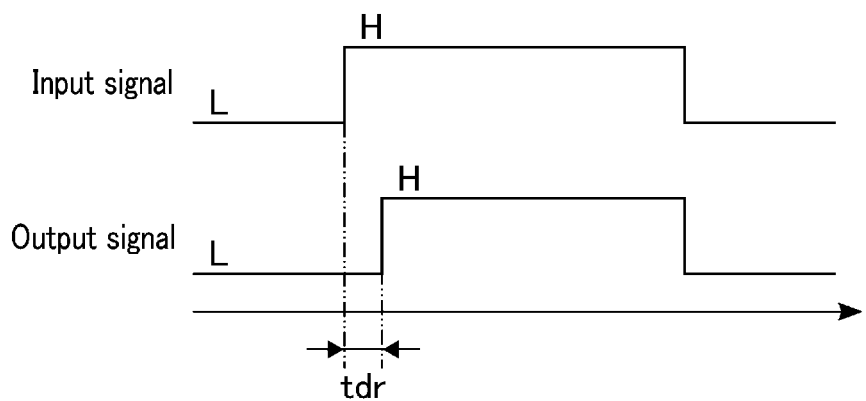
F I G. 20

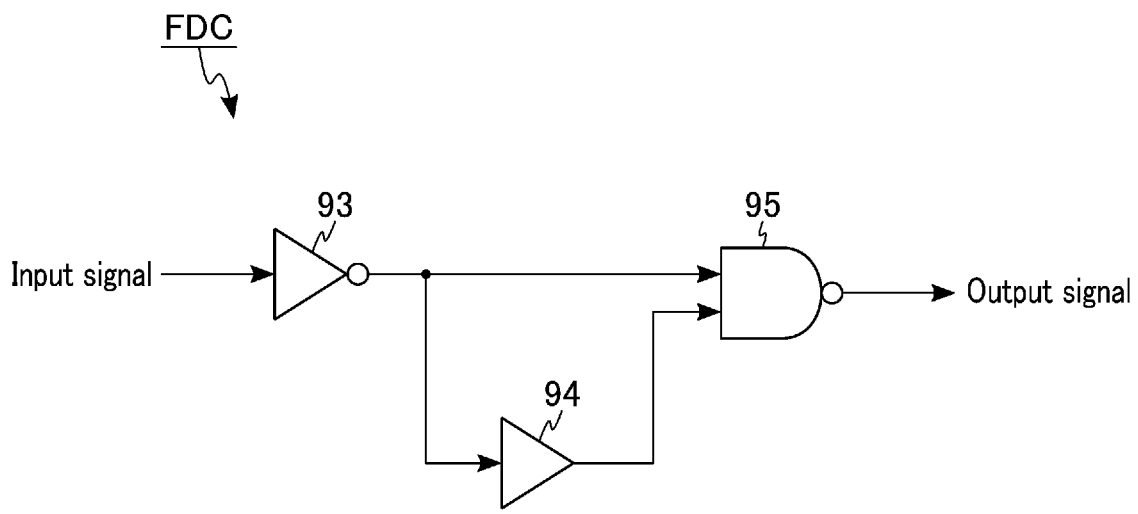
F I G. 21
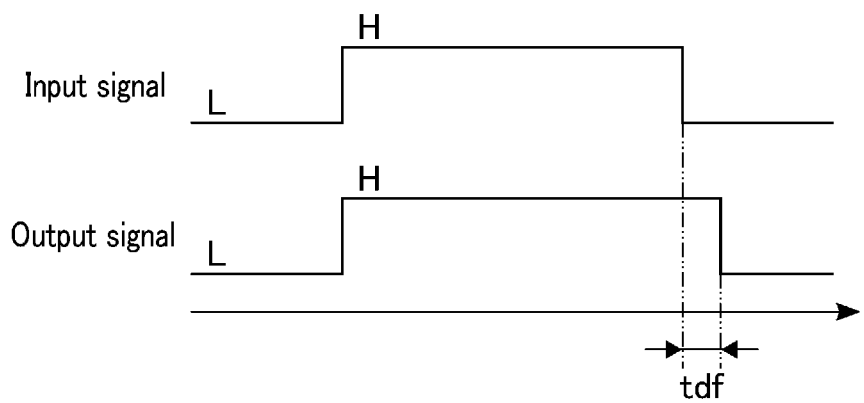
F I G. 22

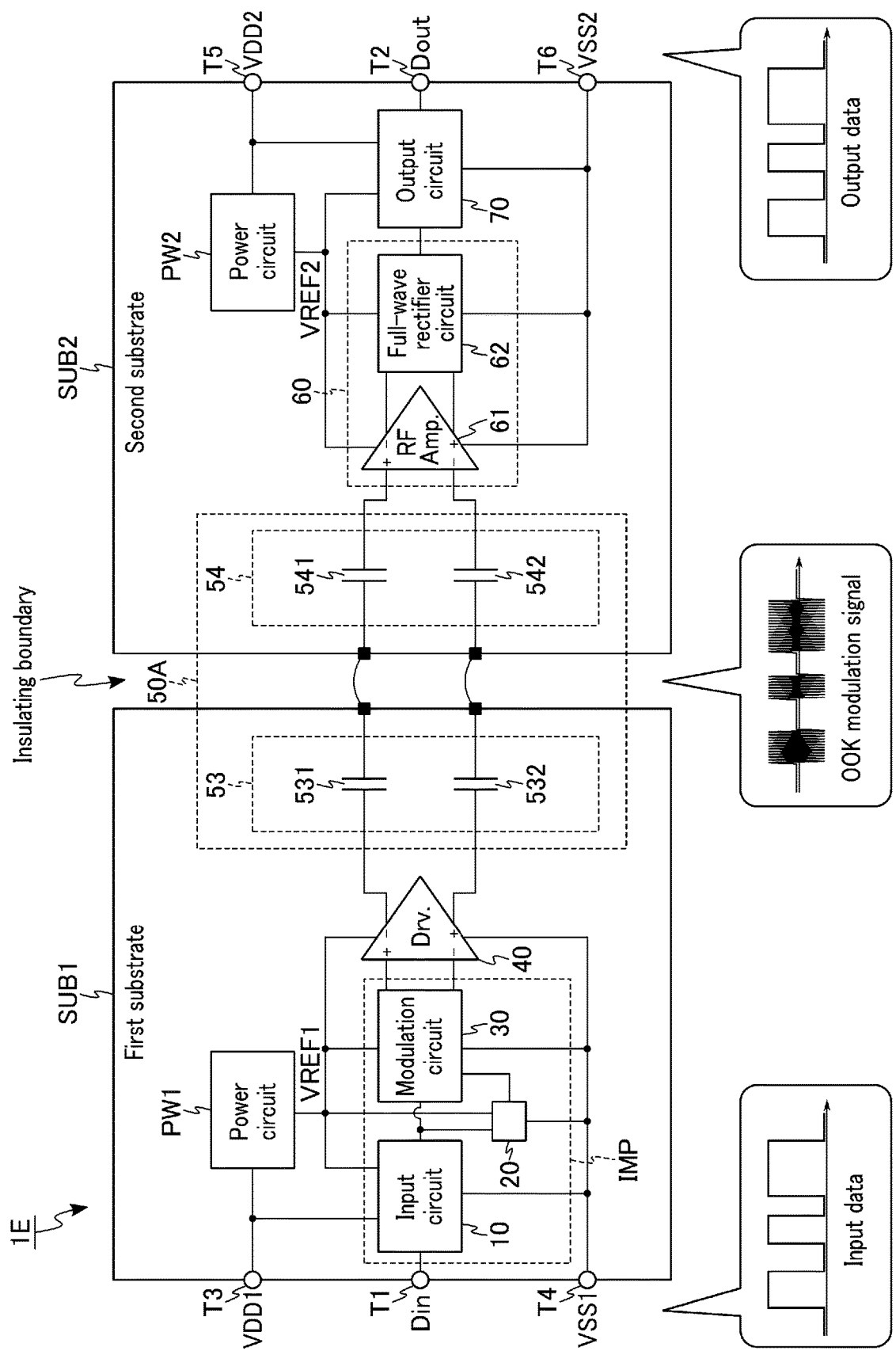
F I G. 23

COMMUNICATION DEVICE

CROSS-REFERENCE TO RELATED APPLICATION(S)

This application is based upon and claims the benefit of priority from Japanese Patent Application No. 2022-174700, filed Oct. 31, 2022, the entire contents of which are incorporated herein by reference.

FIELD

Embodiments described herein relate generally to a communication device.

BACKGROUND

A digital isolator is known as a communication device that transmits a digital signal between a primary-side device and a secondary-side device which are galvanically isolated. In the digital isolator, to transmit a signal between the primary-side device and the secondary-side device, magnetic field coupling by an isolation transformer or electric field coupling by an insulating capacitor is used. That is, the digital isolator implements the signal transmission between the primary-side device and the secondary-side device using a magnetic field or an electric field as a medium. The digital isolator is used in a case where, for example, a high-voltage device and a low-voltage device are connected. In this case, the digital isolator can suppress noise propagation from the high-voltage device to the low-voltage device and a risk of an electric shock on a user.

In the digital isolator, to efficiently perform communication, an input signal modulated to a high frequency band is input to an isolation transformer or an insulating capacitor provided at the insulating boundary between the primary-side device and the secondary-side device. As the modulation method used in the digital isolator, for example, the On Off Keying (OOK) method for expressing digital data based on the presence/absence of a carrier wave is used. In the OOK method, a demodulation circuit can be simplified, and high-speed demodulation processing can be performed. In the digital isolator, it is preferable that the pulse width of an input signal to the primary-side device substantially equals the pulse width of an output signal from the secondary-side device, and a high-quality signal can be transmitted at a high speed between the primary-side device and the secondary-side device.

BRIEF DESCRIPTION OF THE DRAWING(S)

FIG. 1 is a block diagram showing an example of a configuration in a case where N=1 in a communication device according to the first embodiment.

FIG. 2 is a block diagram showing an example of a configuration in a case where N=2 in the communication device according to the first embodiment.

FIG. 3 is a schematic view showing an example of a more detailed configuration of the communication device according to the first embodiment.

FIG. 4 is a circuit diagram showing an example of the circuit configuration of an input modulation unit provided in the communication device according to the first embodiment.

FIG. 5 is a circuit diagram showing an example of the circuit configuration of a transmitting circuit provided in the communication device according to the first embodiment.

FIG. 6 is a circuit diagram showing an example of the circuit configuration of an amplifier circuit provided in the communication device according to the first embodiment.

FIG. 10 is a timing chart showing an operation example of a modulation circuit provided in the communication device according to the first embodiment.

FIG. 13 is a circuit diagram showing an example of the circuit configuration of an input modulation unit provided in a communication device according to the third embodiment.

FIG. 15 is a circuit diagram showing an example of the circuit configuration of an input modulation unit provided in a communication device according to the fourth embodiment.

FIG. 16 is a timing chart showing an operation example of a modulation circuit provided in the communication device according to the fourth embodiment.

FIG. 17 is a block diagram showing an example of the configuration of a communication device according to the fifth embodiment.

FIG. 18 is a circuit diagram showing an example of the circuit configuration of an oscillator provided in the communication device according to the fifth embodiment.

FIG. 19 is a circuit diagram showing an example of the circuit configuration of a rise delay circuit.

FIG. 20 is a timing chart showing an example of the characteristic of the rise delay circuit.

FIG. 21 is a circuit diagram showing an example of the circuit configuration of a fall delay circuit.

FIG. 22 is a timing chart showing an example of the characteristic of the fall delay circuit.

FIG. 23 is a circuit diagram showing an example of the circuit configuration of a communication device according to the first modification of the first embodiment.

DETAILED DESCRIPTION

Figure 7:
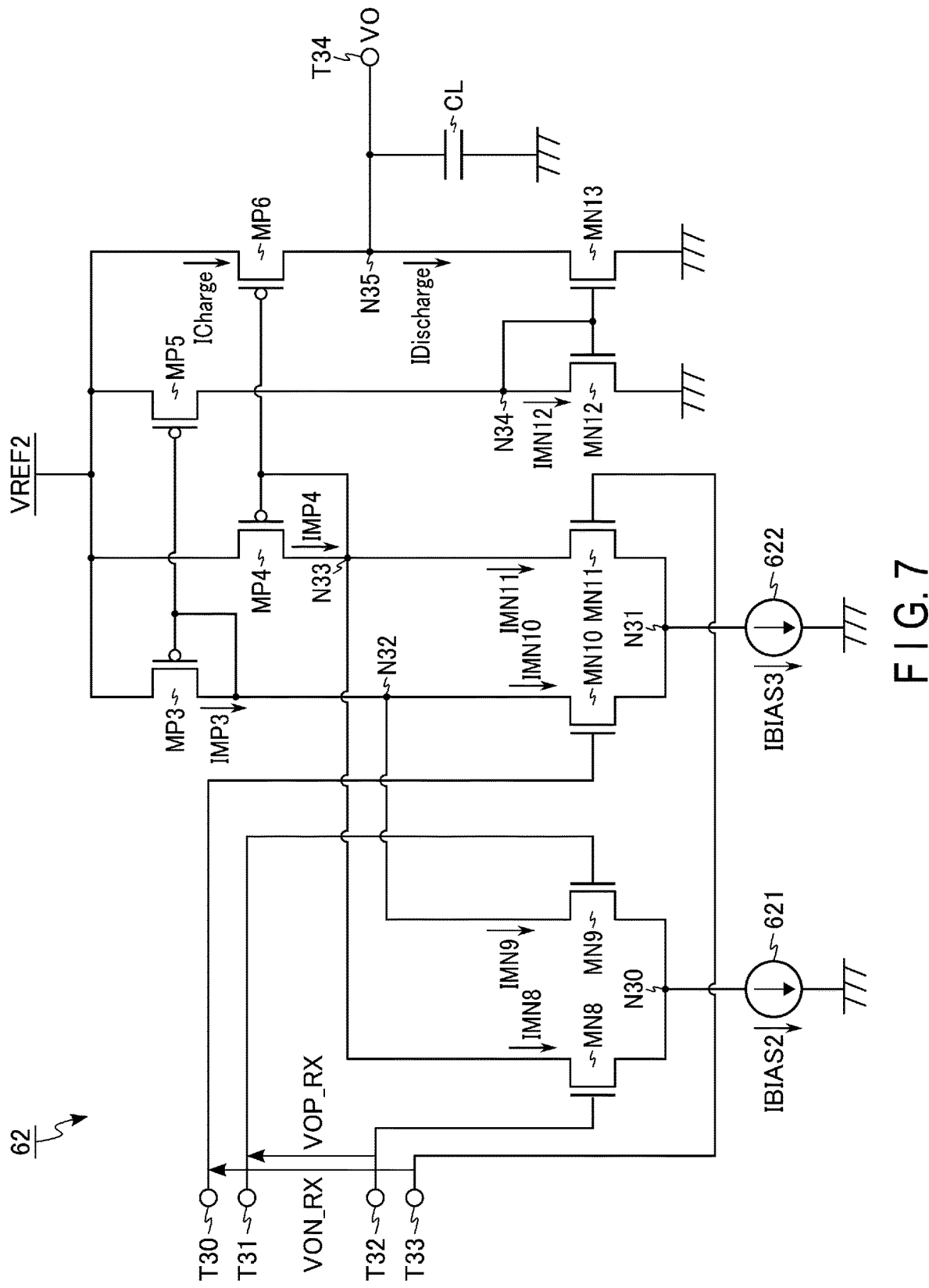
FIG. 7 is a circuit diagram showing an example of the circuit configuration of a full-wave rectifier circuit provided in the communication device according to the first embodiment.

In general, according to one embodiment, a communication device includes a first substrate, a second substrate and a first insulation element. The first substrate includes an oscillator and a first modulation circuit. The first substrate and the second substrate are each insulated. The second substrate includes a first receive circuit and a first output circuit. The first insulation element is connected between the first modulation circuit and the first receive circuit. The oscillator outputs a carrier signal in a high frequency band. The first modulation circuit includes at least one delay circuit, outputs a first modulated signal based on the carrier signal if a first input signal input from an outside has a first logic level, and using the at least one delay circuit, adjusts a length of a period to output the first modulated signal shorter or longer than a period when the first input signal has the first logic level. The first receive circuit receives a first electrical signal based on the first modulated signal via the first insulation element and demodulates the first electrical signal. The first output circuit outputs, to the outside, a first output signal based on the first electrical signal demodulated by the first receive circuit.

Hereinafter, embodiments will be described with reference to the accompanying drawings. The embodiments exemplarily show devices and methods for embodying the technical idea of the present invention. The drawings are schematic or conceptual drawings, and the dimensions, ratios, and the like in the drawings do not necessarily match the reality. In the following explanation, constituent elements having substantially same functions and configurations are denoted by the same reference numerals. In this specification, reference numerals with "hyphen+number" are used to discriminate between a plurality of constituent elements having similar functions.

In this specification, a signal input to an insulation element (an isolation transformer or an insulating capacitor) in a digital isolator used in the On Off Keying (OOK) method will be referred to as an "OOK modulation signal". In this specification, a case where if a logic level is "L (Low)" level, there is no signal being input to the insulation element, and if a logic level is "H (High)" level, the high frequency signal is transmitted by the insulation element will be described. That is, "H" level corresponds to the inverse logic level of "L" level. Note that the association between the presence/absence of an input signal and the logic level may be changed in accordance with the circuit configuration.

<1> First Embodiment

A communication device 1 according to the first embodiment is a digital isolator using magnetic field coupling by an isolation transformer. A primary-side device in the communication device 1 has a function of making a period when an OOK modulation signal based on the pulse of an input signal is output shorter than the pulse width of the input signal. Details of the first embodiment will be described below. In the following description, N is an integer of 1 or more, and is associated with the number of channels of the communication device 1.

<1-1> Configuration

<1-1-1> Configuration of Communication Device 1

FIG. 1 is a block diagram showing an example of a configuration in a case where N=1 in the communication device 1 according to the first embodiment. That is, FIG. 1 exemplarily shows the communication device 1 formed by one channel. As shown in FIG. 1, the communication device 1 of N=1 includes, for example, an input circuit 10, an oscillator 20, a modulation circuit 30, a transmitting circuit 40, an insulation element 50, a receive circuit 60, an output circuit 70, an input terminal T1, an output terminal T2, a first substrate SUB1, and a second substrate SUB2.

The input circuit 10, the oscillator 20, the modulation circuit 30, the transmitting circuit 40, and the input terminal T1 are mounted on the first substrate SUB1. The receive circuit 60, the output circuit 70, and the output terminal T2 are mounted on the second substrate SUB2. The insulation element 50 may be mounted on one of the first substrate SUB1 and the second substrate SUB2 or may be mounted on both the first substrate SUB1 and the second substrate SUB2. The ground level of the first substrate SUB1 and the ground level of the second substrate SUB2 are insulated.

The input circuit 10 is a receive circuit that receives a data signal Din input from an external device to the input terminal T1. The input terminal T1 corresponds to the input terminal of the communication device 1. The input circuit 10 generates an input signal VIN based on the data signal Din. The input circuit 10 then outputs the generated input signal VIN to each of the oscillator 20 and the modulation circuit 30. The input circuit 10 includes, for example, a buffer. In other words, the input circuit 10 buffers an input signal input from an external device to the input terminal T1 and outputs it to each of the oscillator 20 and the modulation circuit 30. The input signal VIN may also be called a "modulation signal".

The oscillator 20 is a signal generator that generates a signal in a high frequency band based on the input signal VIN. The signal in the high frequency band generated by the oscillator 20 will be referred to as a "carrier signal CS" hereinafter. The high frequency band in this specification is, for example, 500 MHz or more. For example, the oscillator 20 generates the carrier signal CS in a period when the input signal VIN is at "H" level, and stops generation of the carrier signal CS in a period when the input signal VIN is at "L" level. The oscillator 20 outputs the generated carrier signal CS to the modulation circuit 30. The oscillator 20 includes, for example, a ring oscillator. In the communication device 1 of N=1, the input signal VIN and the carrier signal CS operate in synchronism.

The modulation circuit 30 modulates the input signal VIN input from the input circuit 10 using the carrier signal CS. For example, in the period when the input signal VIN is "H" level, the modulation circuit 30 outputs, to the transmitting circuit 40, a signal on the positive phase side and a signal on the negative phase side based on the carrier signal CS. On the other hand, in the period when the input signal VIN is "L" level, the modulation circuit 30 stops the output of the signals based on the carrier signal CS. In this state, the voltage levels of the positive phase input terminal and the negative phase input terminal of the transmitting circuit 40 substantially equal. The input signal VIN modulated by the modulation circuit 30 may be called a "modulated signal". In the communication device 1, the set of the oscillator 20 and the modulation circuit 30 may be called an "OOK modulation circuit".

The transmitting circuit 40 generates differential signals based on the modulated signals on the positive and negative phase sides, which are inputted from the modulation circuit 30. The transmitting circuit 40 then outputs the generated differential signals to the insulation element 50. If the insulation element 50 is an isolation transformer, the transmitting circuit 40 supplies differential currents based on the modulated signals on the positive and negative phase sides to the insulation element 50. The differential signals generated by the transmitting circuit 40 correspond to OOK modulation signals.

The insulation element 50 is used to transmit a signal by the OOK method. The insulation element 50 includes at least one isolation transformer. The insulation element 50 transmits electrical signals (differential signals) based on the differential signals input from the transmitting circuit 40 to the receive circuit 60 by magnetic field coupling of the isolation transformer. The insulation element 50 corresponds to the insulating boundary between the first substrate SUB1 and the second substrate SUB2. The insulation element 50 implements galvanic isolation between the first substrate SUB1 and the second substrate SUB2 and may therefore be called a "galvanic isolation element".

The receive circuit 60 is a demodulation circuit that demodulates the electrical signals input from the insulation element 50. The receive circuit 60 outputs the demodulated electrical signal to the output circuit 70.

The output circuit 70 generates an output signal based on the electrical signal demodulated by the receive circuit 60. The output circuit 70 then outputs the generated output signal to the output terminal T2. The output terminal T2 corresponds to the output terminal of the communication device 1. The signal output from the output terminal T2 corresponds to a data signal Dout that the communication device 1 outputs based on the input data signal Din. The output circuit 70 includes, for example, a buffer. In other words, the output circuit 70 buffers the demodulated electrical signal and outputs it as the output signal to the outside via the output terminal T2.

FIG. 2 is a block diagram showing an example of a configuration in a case where N=2 in the communication device 1 according to the first embodiment. That is, FIG. 2 exemplarily shows the communication device 1 formed by two channels. As shown in FIG. 2, the communication device 1 of N=2 includes input circuits 10-1 and 10-2, the oscillator 20, modulation circuits 30-1 and 30-2, transmitting circuits 40-1 and 40-2, insulation elements 50-1 and 50-2, receive circuits 60-1 and 60-2, output circuits 70-1 and 70-2, input terminals T1-1 and T1-2, output terminals T2-1 and T2-2, the first substrate SUB1, and the second substrate SUB2.

The set of the input circuit 10-1, the modulation circuit 30-1, the transmitting circuit 40-1, the insulation element 50-1, the receive circuit 60-1, the output circuit 70-1, the input terminal T1-1, and the output terminal T2-1 corresponds to the first channel of the communication device 1. The first channel transmits a data signal Din<1> input to the input terminal T1-1 via the input circuit 10-1, the modulation circuit 30-1, the transmitting circuit 40-1, the insulation element 50-1, the receive circuit 60-1, and the output circuit 70-1 and outputs a data signal Dout<1> from the output terminal T2-1.

The set of the input circuit 10-2, the modulation circuit 30-2, the transmitting circuit 40-2, the insulation element 50-2, the receive circuit 60-2, the output circuit 70-2, the input terminal T1-2, and the output terminal T2-2 corresponds to the second channel of the communication device 1. The second channel transmits a data signal Din<2> input to the input terminal T1-2 via the input circuit 10-2, the modulation circuit 30-2, the transmitting circuit 40-2, the insulation element 50-2, the receive circuit 60-2, and the output circuit 70-2 and outputs a data signal Dout<2> from the output terminal T2-2.

In the communication device 1 of N=2, the oscillator 20 is shared between the plurality of channels. More specifically, the input circuit 10-1 outputs an input signal VIN<1> generated based on the data signal Din<1> to each of the oscillator 20 and the modulation circuit 30-1. The input circuit 10-2 outputs an input signal VIN<2> generated based on the data signal Din<2> to each of the oscillator 20 and the modulation circuit 30-2. The oscillator 20 then generates the carrier signal CS based on the input signals VIN<1> and VIN<2>.

In the communication device 1 of N=2, the oscillator 20 generates the carrier signal CS in a period when at least one of the input signals VIN<1> and VIN<2> is at "H" level, and stops generation of the carrier signal CS in a period when both the input signals VIN<1> and VIN<2> are at "L" level. The oscillator 20 outputs the generated carrier signal CS to each of the modulation circuits 30-1 and 30-2. In each channel of the communication device 1 of N=2, the input signal VIN and the carrier signal CS may operate asynchronously.

Note that the communication device 1 may be formed by N (N is an integer of 2 or more) channels. Since the input signal VIN and the carrier signal CS are permitted to be asynchronous in each channel, the communication device 1 need only include one oscillator 20 shared by the first to Nth channels. In this case, the oscillator 20 generates the carrier signal CS in a period when at least one of the input signals VIN<1> to VIN<N> is at "H" level, and stops generation of the carrier signal CS in a period when all the input signals VIN<1> to VIN<N> are at "L" level. Note that the first embodiment holds if N is a positive integer. A case where the communication device 1 includes two channels (a case where N=2) will be described below. A set of the input circuit 10, oscillator 20 and modulation circuit 30 will be referred to as "input modulation unit IMP" hereinafter.

FIG. 3 is a schematic view showing an example of a more detailed configuration of the communication device 1 according to the first embodiment. FIG. 3 extracts a configuration associated with input/output of one channel, and shows a typical embodiment of the circuit configuration of a digital isolator used in the OOK method. As shown in FIG. 3, the transmitting circuit 40 is shown as a 2-input 2-output driver circuit (Drv.). The communication device 1 further includes power circuits PW1 and PW2, and power terminals T3, T4, T5, and T6. The power circuit PW1 and the power terminals T3 and T4 are mounted on the first substrate SUB1. The power circuit PW2 and the power terminals T5 and T6 are mounted on the second substrate SUB2.

The power terminal T3 is a terminal used to supply system power to the first substrate SUB1. A power supply voltage VDD1 (for example, 2.25 V to 5.5 V) is applied from an external device to the power terminal T3. The power supply voltage VDD1 is supplied to each of the power circuit PW1 and the input circuit 10 via the power terminal T3. The power terminal T4 is a terminal used to designate the ground level (ground voltage) of the first substrate SUB1. A ground voltage VSS1 is applied from an external device to the power terminal T4. In this specification, a power supply node connected to the power terminal T4 to supply the ground voltage VSS1 will be referred to as "the ground node of the first substrate SUB1".

The power circuit PW1 is a power supply for a MOS transistor mounted on the first substrate SUB1. A transistor in the power circuit PW1 is required to have a withstand voltage of 5.5 V or higher. In this case, a gate width of the transistor in the power circuit PW1 is, for example, 0.6 μm. A transistor in the modulation circuit and the like is required to operate at high speed above 500 MHz. In this case, a gate width of the transistor in the modulation circuit 30 and the like is, for example, 0.13 μm or 0.18 μm. With the gate width of 0.13 μm or 0.18 μm, a withstand voltage of the transistor is 5.5 V or less. Therefore, an output of the power circuit PW1 (for example, 1.5 V) is used as a power supply for those transistors in the modulation circuit 30 and the like.

The power circuit PW1 includes, for example, a Band Gap Reference (BGR) circuit, and a Low Drop Out (LDO) circuit. By the BGR circuit and the LDO circuit, the power circuit PW1 generates a power supply voltage (for example, 1.5 V) for a scaled MOS transistor. The power circuit PW1 supplies the generated power supply voltage to each of the input circuit 10, the oscillator 20, the modulation circuit 30, and the transmitting circuit 40. In this specification, a power supply node to which the power supply voltage generated by the power circuit PW1 is supplied will be referred to as "the power supply node of the first substrate SUB1". The voltage applied to the power supply node of the first substrate SUB1 will be referred to as "VREF1".

The power terminal T5 is a terminal used to supply system power to the second substrate SUB2. A power supply voltage VDD2 (for example, 2.25 V to 5.5 V) is applied from an external device to the power terminal T5. The power supply voltage VDD2 is supplied to each of the power circuit PW2 and the output circuit 70 via the power terminal T5. The power terminal T6 is a terminal used to designate the ground level (ground voltage) of the second substrate SUB2. A ground voltage VSS2 is applied from an external device to the power terminal T6. In this specification, a power supply node connected to the power terminal T6 to supply the ground voltage VSS2 will be referred to as "the ground node of the second substrate SUB2". For example, one of the power supply voltages VDD1 and VDD2 corresponds to the power supply voltage of a high-voltage device, and the other corresponds to the power supply voltage of a low-voltage device.

The power circuit PW2 is a power supply for a MOS transistor mounted on the second substrate SUB2. A transistor in the power circuit PW2 is required to have a withstand voltage of 5.5 V or higher. In this case, a gate width of the transistor in the power circuit PW2 is, for example, 0.6 μm. A transistor in the receive circuit 60 and the like is required to operate at high speed above 500 MHz. In this case, a gate width of the transistor in the receive circuit 60 and the like is, for example, 0.13 μm or 0.18 μm. With the gate width of 0.13 μm or 0.18 μm, a withstand voltage of the transistor is 5.5 V or less. Therefore, an output of the power circuit PW2 (for example, 1.5 V) is used as a power supply for those transistors in the receive circuit 60 and the like.

The power circuit PW2 includes, for example, a BGR circuit, and a LDO circuit. By the BGR circuit and the LDO circuit, the power circuit PW2 generates a power supply voltage (for example, 1.5 V) for a scaled MOS transistor. The power circuit PW2 supplies the generated power supply voltage to each of an amplifier circuit 61, a full-wave rectifier circuit 62, and the output circuit 70. In this specification, a power supply node to which the power supply voltage generated by the power circuit PW2 is supplied will be referred to as "the power supply node of the second substrate SUB2". The voltage applied to the power supply node of the second substrate SUB2 will be referred to as "VREF2".

In addition, the communication device 1 includes, as the insulation element 50 using a magnetic field as a transmission medium, isolation transformers 51 and 52 each having coils formed at the two ends of an insulating layer. The isolation transformers 51 and 52 are mounted on the first substrate SUB1 and the second substrate SUB2, respectively. The isolation transformers 51 and 52 are electrically connected by, for example, bonding wires. More specifically, the isolation transformer 51 includes coils 511 to 514 and an insulating layer 515. The isolation transformer 52 includes coils 521 to 524 and an insulating layer 525.

One end of the coil 511 is connected to the negative phase side output terminal (−) of the transmitting circuit 40. The other end of the coil 511 and one end of the coil 512 are connected to the power terminal T4 (the ground node of the first substrate SUB1). The other end of the coil 512 is connected to the positive phase side output terminal (+) of the transmitting circuit 40. The coils 513 and 514 are connected in series. The coils 511 and 513 are magnetically coupled via the insulating layer 515. The coils 512 and 514 are magnetically coupled via the insulating layer 515. One end of the coil 521 is connected to one end of the serially connected coils 513 and 514 via, for example, a wire bonding. The other end of the coil 521 is connected to one end of the coil 522. The other end of the coil 522 is connected to the other end of the serially connected coils 513 and 514 via, for example, a wire bonding. The coils 521 and 523 are magnetically coupled via the insulating layer 525. The coils 522 and 524 are magnetically coupled via the insulating layer 525. One end of the coil 523 is connected to the negative phase side input terminal (+) of the amplifier circuit 61. The other end of the coil 523 and one end of the coil 524 are connected to the power terminal T6 (the ground node of the second substrate SUB2). The other end of the coil 524 is connected to the negative phase side input terminal (−) of the amplifier circuit 61. Each of the isolation transformers 51 and 52 thus forms a tap type transformer. The insulating layers 515 and 525 are each made of, for example, an oxide film or polyimide.

Also, the receive circuit 60 includes the amplifier circuit 61 and the full-wave rectifier circuit 62. The amplifier circuit 61 amplifies the differential signals (electrical signals) in the high frequency band input from the insulation element 50. The amplifier circuit 61 then outputs the amplified differential signals to the full-wave rectifier circuit 62. The full-wave rectifier circuit 62 performs full-wave rectification of the differential signals input from the amplifier circuit 61. The full-wave rectifier circuit 62 then performs envelope detection for the differential signals that have undergone the full-wave rectification and outputs a signal to the output circuit 70. The amplifier circuit 61 and the full-wave rectifier circuit 62 each include, for example, a differential circuit. Details of the circuit configuration of each of the amplifier circuit 61 and the full-wave rectifier circuit 62 will be described later. Note that the amplifier circuit 61 may be called "Radio Frequency (RF) differential amplifier (RF Amp.)".

In the above-described communication device 1, the pulse of the input data (Din) input to the input terminal T1 of the primary-side device (first substrate SUB1) is converted into an OOK modulation signal based on the carrier signal CS, and transmitted to the secondary-side device (second substrate SUB2) via the insulating boundary (insulation element 50). The secondary-side device reconstructs the data based on the OOK modulation signal, and outputs the pulse of output data (Dout) corresponding to the pulse of the input data.

Note that if the insulation element 50 is formed by isolation transformers, the carrier signal CS in the high frequency band is preferably used to suppress the size of the isolation transformers. Hence, the oscillator 20, the modulation circuit 30, the transmitting circuit 40, and the receive circuit 60 (the amplifier circuit 61 and the full-wave rectifier circuit 62) are formed by scaled MOS transistors such that signals in the high frequency band can be handled. On the other hand, as the system power of the communication device 1, for example, an operation from 2.25 V to 5.5 V is required. Hence, the circuits formed by scaled MOS transistors are driven by a power supply voltage (for example, 1.5 V) that is lower than the system power and is generated by the LDO circuits in the power circuits PW1 and PW2.

Note that in the first embodiment, a case where an isolation transformer is provided on each of the first substrate SUB1 and the second substrate SUB2 has been exemplified. However, the present invention is not limited to this. The isolation transformer may be mounted on one of the first substrate SUB1 and the second substrate SUB2 or may be mounted on both the first substrate SUB1 and the second substrate SUB2.

<1-1-2> Configuration of Modulation Circuit 30

FIG. 4 is a circuit diagram showing an example of the circuit configuration of an input modulation unit IMP provided in the communication device 1 according to the first embodiment. FIG. 4 shows a detailed circuit configuration of the modulation circuit 30. As shown in FIG. 4, the modulation circuit 30 includes, for example, a buffer 301, an inverter 302, AND circuits 303, 304, and 305, inverters 306 and 307, and rise delay circuits RDC1 and RDC2.

The input circuit 10 outputs the input signal VIN to each of the oscillator 20, the rise delay circuit RDC1, the rise delay circuit RDC2, the AND circuit 305, and the inverter 306. The oscillator 20 outputs the carrier signal CS generated based on the input signal VIN to each of the buffer 301 and the inverter 302.

The buffer 301 buffers the carrier signal CS input from the oscillator 20 and outputs the result to the AND circuit 303.

The inverter 302 outputs the carrier signal CS with the inverted logic to the AND circuit 304.

The rise delay circuit RDC1 is a delay circuit that delays the rise of the signal VIN input from the input circuit 10 and outputs it. The delay time of the rise of the signal by the rise delay circuit RDC1 will be referred to as "tdr1" hereinafter. An output signal of the rise delay circuit RDC1 is input signal VINdr1. The rise delay circuit RDC1 outputs the input signal VINdr1 to each of the AND circuits 303 and 304.

The rise delay circuit RDC2 is a delay circuit that delays the rise of the signal VIN input from the input circuit 10 and outputs it. The delay time of the rise of the signal by the rise delay circuit RDC2 will be referred to as "tdr2" hereinafter. An output signal of the rise delay circuit RDC2 is input signal VINdr2. The rise delay circuit RDC2 outputs the input signal VINdr2 to the inverter 307. The inverter 307 outputs the input signal VINdr2 with the inverted logic to the AND circuit 305.

The AND circuit 303 generates a positive phase side modulated signal VINP based on the carrier signal CS input from the buffer 301 and the input signal VINdr1 input from the rise delay circuit RDC1. That is, the output of the AND circuit 303 is associated with the positive phase side signal of the OOK modulation signal.

The AND circuit 304 generates a negative phase side modulated signal VINN based on the inverted carrier signal CS input from the inverter 302 and the input signal VINdr1 input from the rise delay circuit RDC1. That is, the output of the AND circuit 304 is associated with the negative phase side signal of the OOK modulation signal.

The AND circuit 305 generates a pulse based on the signal VIN input from the input circuit 10 and the inverted input signal VINdr2 input from the inverter 307. If tdr2 is longer than tdr1, the AND circuit 305 generates a pulse corresponding to (tdr2−tdr1) and outputs it as a boost signal VBST to the transmitting circuit 40. The boost signal VBST is a control signal used to control a boost circuit BC included in the transmitting circuit 40. Details of the boost circuit BC will be described later.

The inverter 306 outputs the input signal VIN with the inverted logic as a shunt signal VSHT to the transmitting circuit 40. The shunt signal VSHT is a control signal used to control a shunt circuit SC included in the transmitting circuit 40. Details of the shunt circuit SC will be described later.

In the communication device 1, the positive phase side modulated signal VINP output from the modulation circuit 30, the negative phase side modulated signal VINN, the boost signal VBST, and the shunt signal VSHT synchronize. In other words, the OOK modulation signal, the boost signal VBST, and the shunt signal VSHT synchronize.

<1-1-3> Configuration of Transmitting Circuit 40

FIG. 5 is a circuit diagram showing an example of the circuit configuration of the transmitting circuit 40 provided in the communication device 1 according to the first embodiment. As shown in FIG. 5, the transmitting circuit 40 includes, for example, PMOS transistors MP1 and MP2, NMOS transistors MN1 to MN5, resistances RP, RN, RLP_TX, and RLN_TX, capacitors CP_TX, CN_TX, and CC, input terminals T10 to T13, output terminals T14 and T15, and nodes N10 to N15.

The input terminal T10 is the positive phase side input terminal of the transmitting circuit 40. The modulated signal VINP output from the modulation circuit 30 is input to the input terminal T10. The input terminal T10 is connected to the gate terminals of the PMOS transistor MP2 and the NMOS transistor MN2. The input terminal T11 is the negative phase side input terminal of the transmitting circuit 40. The modulated signal VINN output from the modulation circuit 30 is input to the input terminal T11. The input terminal T11 is connected to the gate terminals of the PMOS transistor MP1 and the NMOS transistor MN1.

The source terminals of the PMOS transistors MP1 and MP2 are connected to the power supply node of the first substrate SUB1. That is, VREF1 is applied by the power circuit PW1 to the source terminals of the PMOS transistors MP1 and MP2. The drain terminals of the PMOS transistors MP1 and MP2 are connected to the nodes N10 and N11, respectively. The drain terminals of the NMOS transistors MN1 and MN2 are connected to the nodes N10 and N11, respectively. The source terminals of the NMOS transistors MN1 and MN2 are connected to the ground node of the first substrate SUB1. The set of the PMOS transistors MP1 and MP2 and the set of the NMOS transistors MN1 and MN2 operate as differential inverter circuits.

The NMOS transistor MN3 and the resistance RP are connected in parallel between the nodes N10 and N12. The NMOS transistor MN4 and the resistance RN are connected in parallel between the nodes N11 and N13. The gate terminals of the NMOS transistors MN3 and MN4 are connected to the input terminal T12. The boost signal VBST is input to the input terminal T12. The set of the NMOS transistors MN3 and MN4 corresponds to the boost circuit BC controlled by the boost signal VBST.

The capacitor CP_TX is connected between the nodes N12 and N14. The capacitor CN_TX is connected between the nodes N13 and N15.

The drain terminal and the source terminal of the NMOS transistor MN5 are connected to the nodes N14 and N15, respectively. The gate terminal of the NMOS transistor MN5 is connected to the input terminal T13. The shunt signal VSHT is input to the input terminal T13. The NMOS transistor MN5 corresponds to the shunt circuit SC controlled by the shunt signal VSHT.

The resistance RLP_TX is connected between the node N14 and the ground node of the first substrate SUB1. The resistance RLN_TX is connected between the node N15 and the ground node of the first substrate SUB1. The capacitor CC is connected between the nodes N14 and N15.

The output terminal T14 is connected to the node N14. A signal output from the output terminal T14 corresponds to a positive phase side differential signal VOP_TX output from the transmitting circuit 40. The output terminal T15 is connected to the node N15. A signal output from the output terminal T15 corresponds to a negative phase side differential signal VON_TX output from the transmitting circuit 40. The differential signals VOP_TX and VON_TX are input to the insulation element 50 (isolation transformer 51).

The above-described transmitting circuit 40 can operate by the differential inverter circuits (MP1, MN1, MP2, and MN2) and supply differential currents to the insulation element 50 (isolation transformer 51). On the other hand, if a common mode current flows from the primary-side device to the secondary-side device, the radiation Electro Magnetic Interference (EMI) may degrade. To prevent this, in the communication device 1, a parallel resonance circuit is formed by the resonance capacitor (CC) and the inductance of the isolation transformer 51. Hence, the transmitting circuit 40 can suppress transmission of a signal other than a signal based on the carrier signal CS to the secondary-side device and improve the EMI performance.

Also, the communication device 1 preferably has a resistance to a Common Mode Transient Immunity (CMTI) that the ground level on the primary side and the ground level on the secondary side steeply change. In the transmitting circuit 40, the load resistances (RLP_TX and RLN_TX) are connected between a resonance circuit formed by the capacitor CC and the nodes N14 and N15 and the ground level of the first substrate SUB1 (the ground node of the first substrate SUB1). In addition, the capacitors CP_TX and CN_TX are connected between the isolation transformer 51 and the differential inverter circuits (MP1, MN1, MP2, and MN2).

In this example, since a tap type transformer is used as the insulation element 50, most of CMTI noise flows from the isolation transformer 51 to the ground node of the first substrate SUB1. However, a part of the CMTI noise can be applied to the side of the transmitting circuit 40. On the other hand, the CMTI noise is concentrated to a frequency of 10 MHz or less. Hence, the CMTI noise that reaches the transmitting circuit 40 can be suppressed by the capacitors (CP_TX and CN_TX) and the impedance difference between the load resistances (RLP_TX and RLN_TX).

Also, it is difficult for the resonance circuit to do an immediate response because if transmission of the carrier signal CS is started from a no-signal state, a time for charging the capacitor CC is needed. On the other hand, the boost circuit BC turns on the NMOS transistors MN3 and MN4 based on the boost signal VBST when starting transmission of the carrier signal CS from the no-signal state. Then, the resistance value between the nodes N10 and N12 and that between the nodes N11 and N13 lower, and the current amount supplied to the capacitor CC increases. This shortens the charge time of the capacitor CC when the transmission of the carrier signal CS is started from the no-signal state, and the resonance circuit can quickly operate.

On the other hand, if the transmission of the carrier signal CS ends, and the no-signal state is set, the capacitor CC of the resonance circuit is preferably quickly discharged. For this purpose, if the transmission of the carrier signal CS stops, the shunt circuit SC turns on the NMOS transistor MN5 based on the shunt signal VSHT. Then, the nodes N14 and N15 are electrically connected via the NMOS transistor MN5, and one electrode and the other electrode of the capacitor CC become equipotential. This shortens the charge time of the capacitor CC if the transmission of the carrier signal CS is ended, and the no-signal state is set, and the resonance circuit can quickly operate.

<1-1-4> Configuration of Amplifier Circuit 61

FIG. 6 is a circuit diagram showing an example of the circuit configuration of the amplifier circuit 61 provided in the communication device 1 according to the first embodiment. As shown in FIG. 6, the amplifier circuit 61 includes, for example, resistances RLP_RX and RLN_RX, diodes 611 to 614, capacitors CP_RX and CN_RX, a bias circuit 615, a current source 616, resistances RA1, RA2, RB1, and RB2, NMOS transistors MN6 and NM7, input terminals T20 and T21, output terminals T22 to T25, and nodes N20 to N28.

The input terminal T20 is the positive phase side input terminal (+) of the amplifier circuit 61. The differential signal VOP_TX transmitted from the transmitting circuit 40 via the insulation element 50 is input to the input terminal T20. The input terminal T21 is the negative phase side input terminal (−) of the amplifier circuit 61. The differential signal VON_TX transmitted from the transmitting circuit 40 via the insulation element 50 is input to the input terminal T21. The potential difference between the input terminals T20 and T21, that is, the differential output voltage of the isolation transformer 52 will be referred to as "VIN_RX" hereinafter. The input terminals T20 and T21 are connected to the nodes N20 and N21, respectively.

The resistance RLP_RX is connected between the node N20 and the ground node of the second substrate SUB2. The resistance RLN_RX is connected between the node N21 and the ground node of the second substrate SUB2.

The anode of the diode 611 and the cathode of the diode 612 are connected to the node N20. The cathode of the diode 611 and the anode of the diode 612 are connected to the ground node of the second substrate SUB2. The set of the diodes 611 and 612 limits the voltage of the node N20 such that it falls within a predetermined range. The anode of the diode 613 and the cathode of the diode 614 are connected to the node N21. The cathode of the diode 613 and the anode of the diode 614 are connected to the ground node of the second substrate SUB2. The set of the diodes 613 and 614 limits the voltage of the node N21 such that it falls within a predetermined range.

The capacitor CP_RX is connected between the nodes N20 and N22. The capacitor CN_RX is connected between the nodes N21 and N23.

The bias circuit 615 applies a bias voltage to the nodes N22 and N23. Hence, with respect to the bias voltage as the reference, the voltage of the node N22 changes based on the voltage of the other electrode of the capacitor CP_RX (the positive phase side output voltage of the insulation element 50). With respect to the bias voltage as the reference, the voltage of the node N23 changes based on the voltage of the other electrode of the capacitor CN_RX (the negative phase side output voltage of the insulation element 50). The bias voltage is, for example, VREF2/2.

The resistance RA1 is connected between the node N24 and the power supply node of the second substrate SUB2. The resistance RA2 is connected between the node N25 and the power supply node of the second substrate SUB2. That is, VREF2 is applied by the power circuit PW2 to one terminal of each of the resistances RA1 and RA2. The resistance value of the resistance RA1 is designed to substantially equal the resistance value of the resistance RA2. The resistance RB1 is connected between the nodes N24 and N26. The resistance RB2 is connected between the nodes N25 and N27. The resistance value of the resistance RB1 is designed to substantially equal the resistance value of the resistance RB2. The gate terminals of the NMOS transistors MN6 and MN7 are connected to the nodes N22 and N23, respectively. The drain terminals of the NMOS transistors MN6 and MN7 are connected to the nodes N26 and N27, respectively. The source terminals of the NMOS transistors MN6 and MN7 are connected to the node N28. The current source 616 is connected between the node N28 and the ground node of the second substrate SUB2. The current source 616 adjusts the current amount flowing from the node N28 to the ground node of the second substrate SUB2 to IBIAS1. The bias current IBIAS1 corresponds to the sum of a drain current IMN6 of the NMOS transistor MN6 and a drain current IMN7 of the NMOS transistor MN7. Hence, the set of the NMOS transistors MN6 and MN7 and the current source 616 forms a differential circuit (differential amplifier circuit).

The output terminal T22 is connected to the node N25. The output terminal T23 is connected to the node N24. The output terminal T24 is connected to the node N27. The output terminal T25 is connected to the node N26. The set of the output terminals T23 and T24 corresponds to an output terminal that outputs the positive phase side differential voltage of the amplifier circuit 61. The set of the output terminals T22 and T25 corresponds to an output terminal that outputs the negative phase side differential voltage of the amplifier circuit 61. The potential difference between the output terminals T23 and T24 will be referred to as "VOP_RX" hereinafter. The potential difference between the output terminals T22 and T25 will be referred to as "VON_RX".

As described above, the insulation element 50 and the differential circuit included in the amplifier circuit 61 are connected by the capacitors (CP_RX and CN_RX). In this example, since a tap type transformer is used as the insulation element 50 (isolation transformer 52), most of CMTI noise flows from the isolation transformer 52 to the ground node of the second substrate SUB2. However, a part of the CMTI noise can be applied to the side of the amplifier circuit 61. On the other hand, the CMTI noise is concentrated to a frequency of 10 MHz or less. Hence, the CMTI noise that reaches the differential circuit can be suppressed by the capacitors (CP_RX and CN_RX) and the impedance difference between the load resistances (RLP_RX and RLN_RTX).

Furthermore, the output voltage (VIN_RX) from the isolation transformer 52 is amplified by the differential circuit including the NMOS transistors MN6 and MN7. In the amplifier circuit 61, the sizes and the electrical characteristics of the NMOS transistors MN6 and MN7 are designed to substantially equal. That is, the amplifier circuit 61 amplifies a signal from the isolation transformer 52 by the symmetric type differential circuit. For this reason, the amplitude of the CMTI noise to the amplitude of the signal from the isolation transformer 52 is suppressed by the Common Mode Rejection Ratio (CMRR) of the differential circuit. That is, the differential circuit of the amplifier circuit 61 can improve the CMTI resistance.

Also, in the OOK modulation method, differential transmission is preferably performed in consideration of the influence of external noise. However, if the circuit is of a symmetric type, an operation error may occur due to the influence of circuit noise in the no-signal state. Hence, the amplifier circuit 61 has a configuration of receiving a signal based on the carrier signal CS from the primary-side device using a large offset voltage Voffset for the circuit noise. More specifically, the amplifier circuit 61 uses the offset voltage Voffset to VOP_RX and VON_RX by the load resistances (RA1, RA2, RB1, and RB2) of the differential circuit and the bias current IBIAS1 by the current source 616.

VOP_RX in the amplifier circuit 61 is given by $$\mathrm{VOP\_RX} = \frac{IBIAS1 \times RB}{2} - gm\left(RA + \frac{RB}{2}\right) \times \mathrm{VIN\_RX} \quad (1)$$

VON_RX in the amplifier circuit 61 is given by $$\mathrm{VON\_RX} = \frac{IBIAS1 \times RB}{2} + gm\left(RA + \frac{RB}{2}\right) \times \mathrm{VIN\_RX} \quad (2)$$

"RA" in equations (1) and (2) represents the resistance values of the resistances RA1 and RA2. "RB" in equations (1) and (2) represents the resistance values of the resistances RB1 and RB2. "gm" in equations (1) and (2) represents the transconductances of the NMOS transistors MN6 and MN7. As is apparent from equations (1) an (2), an offset voltage of IBIAS1×(RB/2) is added to VOP_RX and VON_RX.

<1-1-5> Configuration of Full-Wave Rectifier Circuit 62

FIG. 7 is a circuit diagram showing an example of the circuit configuration of the full-wave rectifier circuit 62 provided in the communication device 1 according to the first embodiment. As shown in FIG. 7, the full-wave rectifier circuit 62 includes, for example, NMOS transistors MN8 to MN13, PMOS transistors MP3 to MP6, current sources 621 and 622, a capacitor CL, input terminals T30 to T33, an output terminal T34, and nodes N30 to N35.

The input terminal T30 is connected to the output terminal T22. The input terminal T31 is connected to the output terminal T23. The input terminal T32 is connected to the output terminal T24. The input terminal T33 is connected to the output terminal T25. The set of the input terminals T31 and T32 corresponds to the input terminal of the positive phase side differential voltage input to the full-wave rectifier circuit 62. The set of the input terminals T30 and T33 corresponds to the input terminal of the negative phase side differential voltage input to the full-wave rectifier circuit 62. That is, the potential difference between the input terminals T31 and T32 is VOP_RX. The potential difference between the input terminals T30 and T33 is VON_RX.

The gate terminals of the NMOS transistors MN8 and MN9 are connected to the input terminals T32 and T31, respectively. The drain terminals of the NMOS transistors MN8 and MN9 are connected to the nodes N33 and N32, respectively. The source terminals of the NMOS transistors MN8 and MN9 are connected to the node N30. The current source 621 is connected between the node N30 and the ground node of the second substrate SUB2. The current source 621 adjusts the current amount flowing from the node N30 to the ground node of the second substrate SUB2 to IBIAS2. The bias current IBIAS2 corresponds to the sum of a drain current IMN8 of the NMOS transistor MN8 and a drain current IMN9 of the NMOS transistor MN9. Hence, the set of the NMOS transistors MN8 and MN9 and the current source 621 forms a differential amplifier circuit.

The gate terminals of the NMOS transistors MN10 and MN11 are connected to the input terminals T30 and T33, respectively. The drain terminals of the NMOS transistors MN10 and MN11 are connected to the nodes N32 and N33, respectively. The source terminals of the NMOS transistors MN10 and MN11 are connected to the node N31. The current source 622 is connected between the node N31 and the ground node of the second substrate SUB2. The current source 622 adjusts the current amount flowing from the node N31 to the ground node of the second substrate SUB2 to IBIAS3. The bias current IBIAS3 corresponds to the sum of a drain current IMN10 of the NMOS transistor MN10 and a drain current IMN11 of the NMOS transistor MN11. Hence, the set of the NMOS transistors MN10 and MN11 and the current source 622 forms a differential amplifier circuit.

The source terminals of the PMOS transistors MP3, MP4, MP5, and MP6 are connected to the power supply node of the second substrate SUB2. That is, VREF2 is applied by the power circuit PW2 to the source terminals of the PMOS transistors MP3, MP4, MP5, and MP6. The gate terminal and the drain terminal of the PMOS transistor MP3 are connected to the node N32. The gate terminal and the drain terminal of the PMOS transistor MP4 are connected to the node N33. The gate terminal of the PMOS transistor MP5 is connected to the node N32. The drain terminal of the PMOS transistor MP5 is connected to the node N34. The gate terminal of the PMOS transistor MP6 is connected to the node N33. The drain terminal of the PMOS transistor MP6 is connected to the node N35. Thus, the set of the PMOS transistors MP3 and MP5 and the set of the PMOS transistors MP4 and MP6 each form a current mirror circuit. Hence, a drain current IMP3 of the PMOS transistor MP3 is mirrored to the PMOS transistor MP5. Similarly, a drain current IMP4 of the PMOS transistor MP4 is mirrored to the PMOS transistor MP6.

The gate terminal and the drain terminal of the NMOS transistor MN12 are connected to the node N34. The source terminal of the NMOS transistor MN12 is connected to the ground node of the second substrate SUB2. The gate terminal of the NMOS transistor MN13 is connected to the node N34. The drain terminal of the NMOS transistor MN13 is connected to the node N35. The source terminal of the NMOS transistor MN13 is connected to the ground node of the second substrate SUB2. Thus, the set of the NMOS transistors MN12 and MN13 forms a current mirror circuit. Hence, a drain current of the NMOS transistor MN12 is mirrored to the NMOS transistor MN13.

The capacitor CL is connected between the node N35 and the ground node of the second substrate SUB2. The capacitor CL represents the load capacitor of the full-wave rectifier circuit 62. The capacitor CL may be considered as the input capacitor of the output circuit 70. The output terminal T34 is connected to the node N35. The output terminal T34 corresponds to an output terminal that outputs an output signal VO of the full-wave rectifier circuit 62, that is, an OOK modulation signal demodulated by the receive circuit 60 (the set of the amplifier circuit 61 and the full-wave rectifier circuit 62).

As described above, the full-wave rectifier circuit 62 performs full-wave rectification and envelope detection of VOP_RX and VON_RX by the differential circuit. In the full-wave rectifier circuit 62, the sizes and the electrical characteristics of the NMOS transistors MN8, MN9, MN10, and MN11 are designed to substantially equal. Also, the bias currents IBIAS2 and IBIAS3 are also designed to substantially equal.

A current flowing to the node N33 corresponds to the sum of the drain current IMN8 of the NMOS transistor MN8 and the drain current IMN11 of the NMOS transistor MN11. The current flowing to the node N33 is mirrored by the PMOS transistors MP4 and MP6 and changes to a charge current ICharge that charges the capacitor CL. The current mirror ratio of the PMOS transistors MP4 and MP6 is, for example, 1:1.

A current flowing to the node N32 corresponds to the sum of the drain current IMN9 of the NMOS transistor MN9 and the drain current IMN10 of the NMOS transistor MN10. The current flowing to the node N32 is mirrored by the PMOS transistors MP3 and MP5 and input to the node N34. Furthermore, the current input to the node N34 is mirrored by the NMOS transistors MN12 and MN13 and changes to a discharge current IDischarge that discharges the capacitor CL. If the current mirror ratio of the PMOS transistors MP3 and MP5 is 1:1, the current mirror ratio of the NMOS transistors MN12 and MN13 is designed to, for example, 2:1. Note that the current mirror ratio of the PMOS transistors MP3 and MP5 may be 2:1. In this case, the current mirror ratio of the NMOS transistors MN12 and MN13 is designed to 1:1. In the full-wave rectifier circuit 62, IDischarge need only be designed to be smaller than the sum of the drain current IMN9 of the NMOS transistor MN9 and the drain current IMN10 of the NMOS transistor MN10.

The voltage value of the output signal VO of the full-wave rectifier circuit 62 is given by $$VO = \frac{1}{CL} \int \{ICharge(t) - IDischarge(t)\}dt \tag{3}$$

As shown by equation (3), the voltage value of the output signal VO of the full-wave rectifier circuit 62 is proportional to a charge amount charged in the capacitor CL.

Note that in the communication device 1 according to the first embodiment, the sizes and the electrical characteristics of a pair of MOS transistors used for the input of the differential circuit included in the receive circuit 60 are designed to substantially equal. That is, the two transistors used in the differential circuit are provided symmetrically. Hence, the receive circuit 60 can improve the CMTI resistance. In addition, since the sizes and the electrical characteristics of the pair of MOS transistors are designed to substantially equal, a large change of the characteristics of the pair of MOS transistors of the differential circuit due to a process is suppressed, and the stable receive circuit 60 can be implemented.

<1-2> Operation

An example of the operation of the communication device 1 according to the first embodiment will be described below.
<1-2-1> Operation Example of Receive Circuit 60

Figure 8:
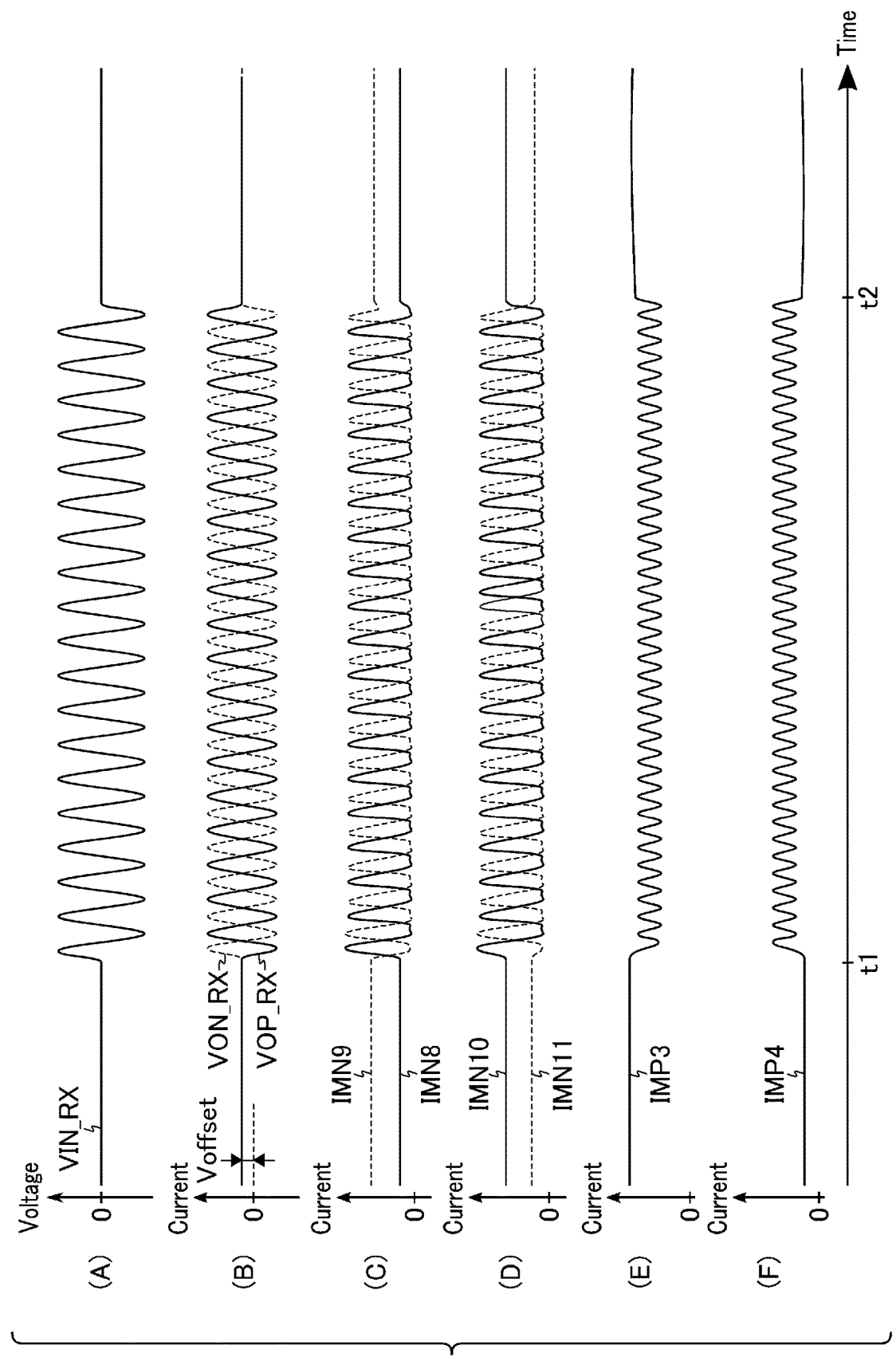
FIG. 8 is a timing chart showing a first operation example of a receive circuit provided in the communication device according to the first embodiment.

An operation example of the differential circuit included in the receive circuit 60 will be described below with reference to FIG. 8. FIG. 8 is a timing chart showing a first operation example of the receive circuit 60 provided in the communication device 1 according to the first embodiment. (A) of FIG. 8 shows the differential output voltage (VIN_RX) of the isolation transformer 52. (B) of FIG. 8 shows the output voltages (VOP_RX and VON_RX) of the amplifier circuit 61. (C) of FIG. 8 shows the drain currents IMN8 and IMN9 of the NMOS transistors MN8 and MN9. (D) of FIG. 8 shows the drain currents IMN10 and IMN11 of the NMOS transistors MN10 and MN11. (E) of FIG. 8 shows the drain current IMP3 of the PMOS transistor MP3. (F) of FIG. 8 shows the drain current IMP4 of the PMOS transistor MP4. In FIG. 8, t1 represents the timing at which the input signal VIN changes from "L" level to "H" level. In FIG. 8, t2 represents the timing at which the input signal VIN changes from "H" level to "L" level.

In the no-signal state (VIN=0 V), VIN_RX is close to 0 V. On the other hand, in the period between the times t1 and t2, VIN_RX is a signal in the high frequency band. The signal in the high frequency band is generated based on the carrier signal CS.

Since the amplifier circuit 61 amplifies differential input voltages, VOP_RX and VON_RX exhibit negative phase operations. However, in the no-signal state, the offset voltage Voffset is added to each of VON_RX and VON_RX.

In the no-signal state (VIN=0 V), VOP_RX=VON_RX=VOffset>0 V. Hence, IMN9 is larger than IMN8, and IMN10 is larger than IMN11. As a result, IMP3 that is the sum of IMN9 and IMN10 is large, and IMP4 that is the sum of IMN8 and IMN11 is small.

If VIN>0 V, VOP_RX decreases, and VON_RX increases. Hence, IMN8 increases, IMN9 decreases, IMN10 increases, and IMN11 decreases. However, since IMN9 and IMN10 in the no-signal state are large, the decrease amount of IMN9 is large, but the increase amount of IMN10 is small. As a result, IMP3 decreases. On the other hand, since IMN8 and IMN11 in the no-signal state are small, the increase amount of IMN8 is large, but the decrease amount of IMN11 is small. As a result, IMP4 increases.

If VIN<0 V, VOP_RX increases, and VON_RX decreases. Hence, IMN8 decreases, IMN9 increases, IMN10 decreases, and IMN11 increases. However, since IMN9 and IMN10 in the no-signal state are large, the increase amount of IMN9 is small, but the decrease amount of IMN10 is large. As a result, IMP3 increases. On the other hand, since IMN8 and IMN11 in the no-signal state are large, the decrease amount of IMN8 is small, but the increase amount of IMN11 is large. As a result, IMP4 decreases.

As described above, the receive circuit 60 operates based on the input signal VIN, thereby obtaining, from the input voltage (VIN_RX), IMP3 and IMP4 that are full-wave rectified currents.

Figure 9:
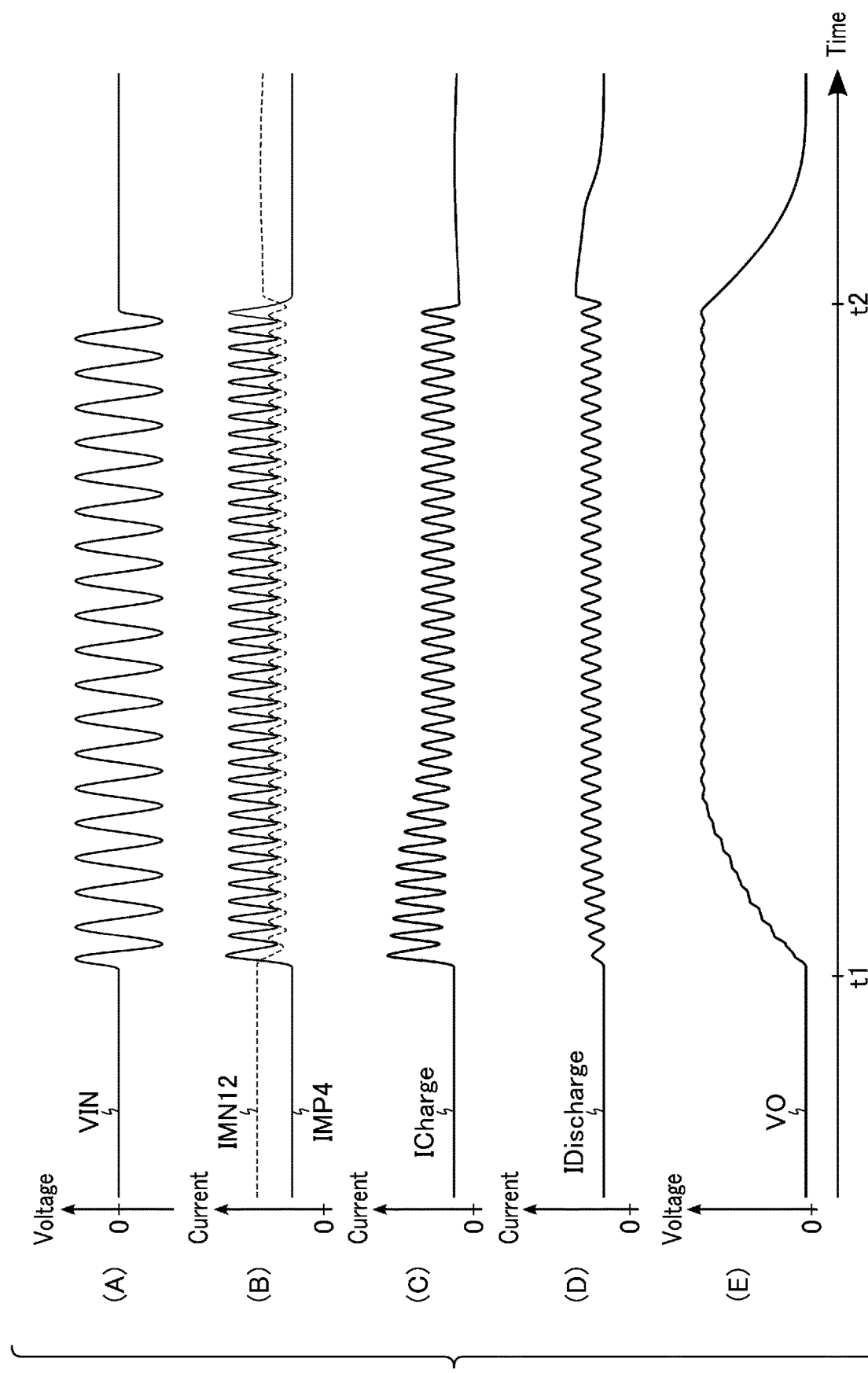
FIG. 9 is a timing chart showing a second operation example of the receive circuit provided in the communication device according to the first embodiment.

The relationship between the drain current IMP4 of the PMOS transistor MP4, which is a full-wave rectified current, and the output signal VO, will be described below with reference to FIG. 9. FIG. 9 is a timing chart showing a second operation example of the receive circuit 60 provided in the communication device 1 according to the first embodiment. (A) of FIG. 9 shows the output voltage (VIN_RX) of the isolation transformer 52, like (A) of FIG. 8. (B) of FIG. 9 shows the drain currents IMP4 and IMN12 of the PMOS transistor MP4 and the NMOS transistor MN12. (C) and (D) of FIG. 9 show the charge current ICharge and the discharge current IDischarge, respectively. (E) of FIG. 9 shows the output signal VO. In FIG. 9, t1 represents the timing at which the input signal VIN changes from "L" level to "H" level. In FIG. 9, t2 represents the timing at which the input signal VIN changes from "H" level to "L" level.

The PMOS transistors MP4 and MP6 form a current mirror circuit. The current mirror ratio of the PMOS transistors MP4 and MP6 is, for example, 1:1. Hence, the drain current IMP4 of the PMOS transistor MP4 is the charge current ICharge that charges the capacitor CL.

On the other hand, the drain current IMP3 of the PMOS transistor MP3 is mirrored by the PMOS transistor MP5, and folded back by the current mirror circuit formed by the NMOS transistor MN12 and the NMOS transistor MN13. For example, the current mirror ratio of the PMOS transistors MP4 and MP6 is 2:1, and the current mirror ratio of the NMOS transistors MN12 and MN13 is 1:1. In this case, a current obtained by halving IMP3 is the discharge current IDischarge that discharges the capacitor CL.

If IMN12 is set to be larger than IMP4 in the no-signal state, IDischarge> ICharge holds, and charges are not accumulated in the capacitor CL. In this case, the output signal VO is 0 V.

On the other hand, if the OOK modulation signal is input (after time t1), in the receive circuit 60, IMP4 increases, and IMN12 decreases. That is, ICharge>IDischarge holds, charges are accumulated in the capacitor CL, and the voltage of the output signal VO rises. If the voltage of the output signal VO rises to a stable state, ICharge≈IDischarge is obtained.

If there is no more OOK modulation signal (time t2), ICharge becomes substantially zero, and the capacitor CL is discharged by IDischarge. IDischarge at this time has a predetermined value. On the other hand, at the time of charging, the capacitor is charged by a full-wave rectification type current. Therefore, the rise of the voltage of the output signal VO is generally slower than the fall of the voltage of the output signal VO.

In the secondary-side device (the receive circuit 60 or the output circuit 70) of the communication device 1, a response time after the OOK modulation signal is input from the no-signal state until the OOK modulation signal is reflected on the output signal VO of the communication device 1 will be referred to as "tON_RX" hereinafter. In the secondary-side device of the communication device 1, a response time after the OOK modulation signal changes to the no-signal state until the no-signal state is reflected on the output signal VO of the communication device 1 will be referred to as "tOFF_RX". A response time after the input signal VIN changes from "L" level to "H" level until the primary-side device (the input circuit 10, the modulation circuit 30, the transmitting circuit 40, or the like) of the communication device 1 outputs the OOK modulation signal will be referred to as "tON_IO". A response time after the input signal VIN changes from "H" level to "L" level until the primary-side device of the communication device 1 stops output of the OOK modulation signal will be referred to as "tOFF_IO".

<1-2-2> Operation Example of Modulation Circuit 30

An operation example of the modulation circuit 30 will be described below with reference to FIG. 10. FIG. 10 is a timing chart showing an operation example of the modulation circuit 30 provided in the communication device 1 according to the first embodiment. (A) of FIG. 10 shows the input signal VIN. (B) of FIG. 10 shows the output signal (carrier signal CS) of the oscillator 20. (C) of FIG. 10 shows the positive phase side modulated signal VINP of the modulation circuit 30. (D) of FIG. 10 shows the negative phase side modulated signal VINN of the modulation circuit 30. (E) and (F) of FIG. 10 show the boost signal VBST and the shunt signal VSHT, respectively. In FIG. 10, t1 represents the timing at which the input signal VIN changes from "L" level to "H" level. In FIG. 10, t2 represents the timing at which the input signal VIN changes from "H" level to "L" level. Note that FIG. 10 exemplarily shows a case where the carrier signal CS in the high frequency band is output based on the input signal VIN of another channel. That is, a case where the input signal VIN to the modulation circuit 30 operates asynchronously with the carrier signal CS will be described.

If the input signal VIN is at "L" level, both the positive phase side modulated signal VINP of the modulation circuit 30 and the negative phase side modulated signal VINN are at "L" level. In this case, the boost signal VBST is at "L" level, and the shunt signal VSHT is at "H" level.

If the input signal VIN changes from "L" level to "H" level, the boost signal VBST changes to "H" level, and the shunt signal VSHT changes to "L" level. If the shunt signal VSHT changes to "L" level, the capacitor CC is set in a chargeable state. If the boost signal VBST changes to "H" level, the charge speed of the capacitor CC for supplying differential signals to the insulation element 50 becomes higher than in a case where the NMOS transistors MN3 and MN4 are OFF (a case where the boost signal VBST is at "L" level).

The input signals VINdr1 and VINdr2 change from "L" level to "H" level after delayed by tdr1 and tdr2, respectively. Based on the change of the input signal VINdr1 to "H" level, the modulation circuit 30 outputs signals (VINP and VINN) in the high frequency band based on the carrier signal CS. Thus, the transmitting circuit 40 starts output of the OOK modulation signal. In a period (boost period) in which the boost signal VBST is at "H" level, and VINP and VINN based on the carrier signal CS are being output, the boost circuit BC increases the charge speed of the capacitor CC. Based on the change of the input signal VINdr2 to "H" level, the boost signal VBST changes to "L" level. That is, the increase of the charge speed of the capacitor CC by the boost circuit BC stops.

If the input signal VIN changes from "H" level to "L" level, the signal changes to "H" level. Based on the change of the input signal VIN to "L" level, the modulation circuit 30 stops the output of the signals (VINP and VINN) in the high frequency band based on the carrier signal CS. Thus, the output of the OOK modulation signal by the transmitting circuit 40 stops, and the no-signal state is obtained. Also, if the shunt signal VSHT changes to "H" level, the charges accumulated in the capacitor CC are discharged by the shunt circuit SC.

Note that in the first embodiment, the length of the boost period is "tdr2−tdr1". That is, in the first embodiment, the delay time tdr2 of the rise delay circuit RDC2 is longer than the delay time tdr1 of the rise delay circuit RDC1. The shunt signal VSHT need only be at "L" level when the carrier (the signal in the high frequency band) exists by the OOK modulation signal. For this reason, the shunt signal VSHT is set to the inverse logic of the input signal VIN.

<1-3> Effects of First Embodiment

According to the communication device 1 of the first embodiment described above, it is possible to transmit a high-quality signal at a high speed between the primary-side device and the secondary-side device. Details of the effects of the first embodiment will be described below.

In general, if the OOK modulation signal is received by a comparator and output from an output buffer, tON_RX is longer than tOFF_RX. If "tON_RX+tON_IO" is larger than "tOFF_RX+tOFF_IO", the pulse width of the output signal VO of the communication device 1 is narrower than the pulse width of the input signal VIN to the communication device 1. That is, if "tON_RX+tON_IO" and "tOFF_RX+tOFF_IO" are different, the pulse width of the output signal VO changes with respect to the pulse width of the input signal VIN. In this case, the upper limit value of the signal transmission speed of the digital isolator can be limited by the changes of the pulse widths of the input signal and the output signal. For this reason, there is a demand for a digital isolator in which the pulse width of the input signal and the pulse width of the output signal substantially equal, and which can perform high-speed high-quality signal transmission.

Hence, the communication device 1 according to the first embodiment includes the modulation circuit 30 suitable for a digital isolator in which "tON_RX+tON_IO" becomes larger than "tOFF_RX+tOFF_IO" (the pulse width becomes narrow by signal transmission). More specifically, the modulation circuit 30 includes a delay circuit (rise delay circuit RDC1) that delays the timing at which the positive and negative phase side modulated signals of the OOK modulation signal become signals based on the carrier signal CS if the input signal VIN changes from "L" level to "H" level. On the other hand, if the input signal VIN changes from "H" level to "L" level, the rise delay circuit RDC1 immediately blocks output of the signals based on the carrier signal CS.

Hence, in the communication device 1 according to the first embodiment, the response time until the modulation circuit 30 outputs the signals based on the carrier signal CS based on the change of the input signal VIN from "L" level to "H" level is longer than the response time until the modulation circuit 30 stops the output of the signals based on the carrier signal CS based on the change of the input signal VIN from "H" level to "L" level. The difference between the response times can be adjusted by the delay time tdr1 of the rise delay circuit RDC1.

As a result, in the communication device 1 according to the first embodiment, adjustment can be performed such that the pulse width of the input signal VIN and the pulse width of the output signal VO substantially equal. Hence, the communication device 1 according to the first embodiment can alleviate the limitation of the upper limit value of the signal transmission speed by the changes of the pulse widths of the input signal and the output signal and implement high-speed signal transmission with high-quality.

Also, the communication device 1 according to the first embodiment is formed by multiple channels, and permits the input signal VIN and the carrier signal CS to operate asynchronously. In the communication device 1 according to the first embodiment, one oscillator 20 is shared by a plurality of channels. As a result, the communication device 1 according to the first embodiment can suppress power consumption as compared to a case where a plurality of oscillators 20 are provided, and suppress the manufacturing cost.

<2> Second Embodiment

A communication device 1A according to the second embodiment has a configuration in which the circuit configuration of an input modulation unit IMP is changed from the communication device 1 according to the first embodiment. A primary-side device in the communication device 1A has a function of making a period to output an OOK modulation signal based on the pulse width of an input signal longer than the pulse width of the input signal. As for details of the second embodiment, points different from the first embodiment will be described below.

<2-1> Configuration

Figure 11:
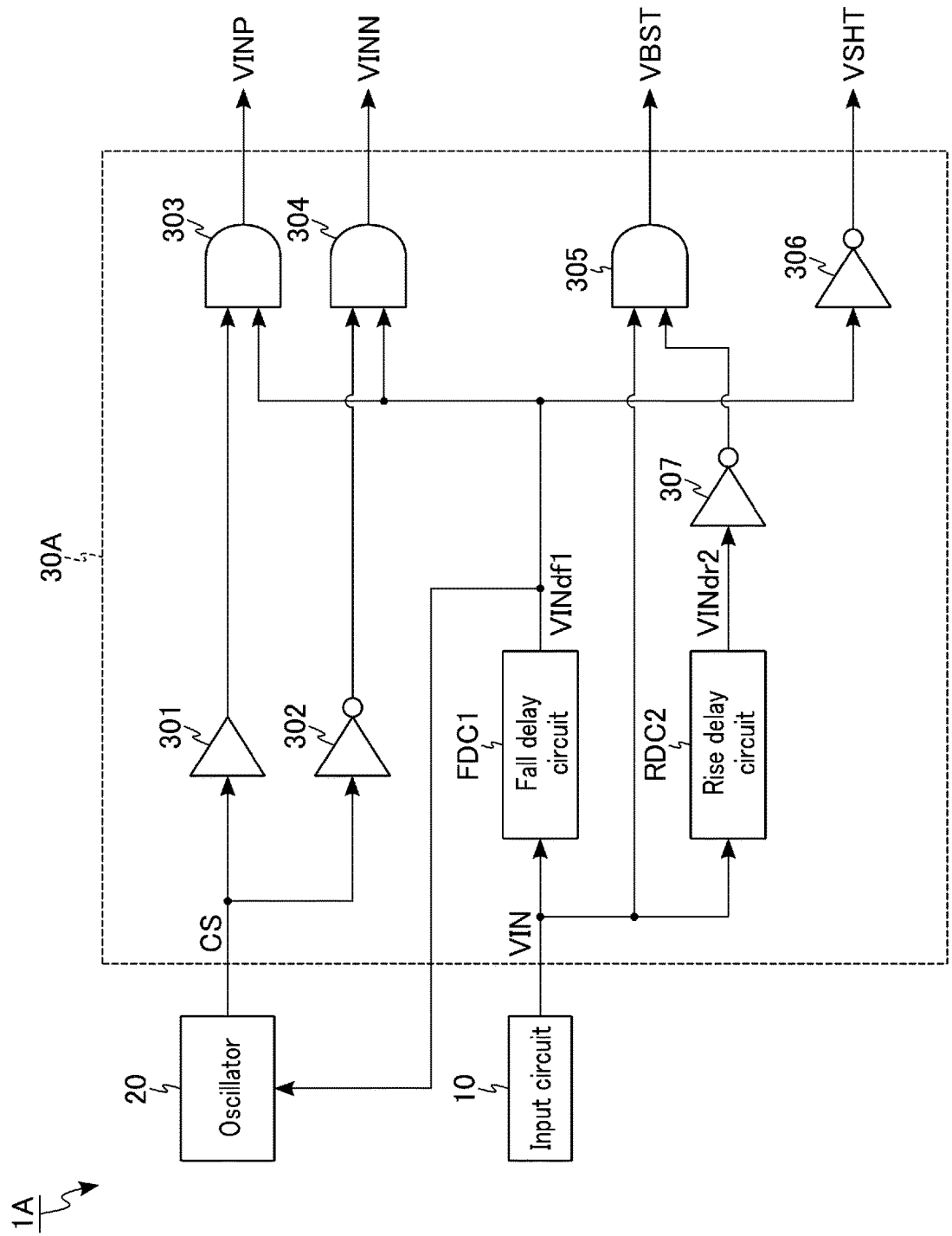
FIG. 11 is a circuit diagram showing an example of the circuit configuration of an input modulation unit provided in a communication device according to the second embodiment.

FIG. 11 is a circuit diagram showing an example of the circuit configuration of the input modulation unit IMP provided in the communication device 1A according to the second embodiment. As shown in FIG. 11, the communication device 1A includes a modulation circuit 30A in place of the modulation circuit 30. The modulation circuit 30A has a configuration in which the rise delay circuit RDC1 in the modulation circuit 30 according to the first embodiment is replaced with a fall delay circuit FDC1.

An input circuit 10 according to the second embodiment outputs an input signal VIN to each of the fall delay circuit FDC1, a rise delay circuit RDC2, and an AND circuit 305.

The fall delay circuit FDC1 is a delay circuit that delays the fall of the signal VIN input from the input circuit 10 and outputs it. The delay time of the fall of the signal by the fall delay circuit FDC1 will be referred to as "tdf1" hereinafter. The input signal VIN delayed by the fall delay circuit FDC1 will be referred to as an "input signal VINdf1". The fall delay circuit FDC1 outputs the input signal VINdf1 based on the input signal VIN to each of an oscillator 20, an AND circuit 303, an AND circuit 304, and an inverter 306. The oscillator 20 according to the second embodiment outputs a carrier signal CS generated based on the input signal VINdf1 input from the fall delay circuit FDC1 to each of a buffer 301 and an inverter 302.

The AND circuit 303 according to the second embodiment performs an AND operation between the carrier signal CS input from the buffer 301 and the input signal VINdf1 input from the fall delay circuit FDC1. The AND circuit 303 then outputs the operation result as a positive phase side modulated signal VINP to a transmitting circuit 40.

The AND circuit 304 according to the second embodiment generates a negative phase side modulated signal VINN based on the carrier signal CS input from the inverter 302 and the input signal VINdf1 input from the fall delay circuit FDC1.

The inverter 306 according to the second embodiment then outputs the input signal VINdf1 with the inverted logic as a shunt signal VSHT to the transmitting circuit 40.

The rest of the configuration of the communication device 1A according to the second embodiment is the same as that of the communication device 1 according to the first embodiment.

<2-2> Operation

Figure 12:
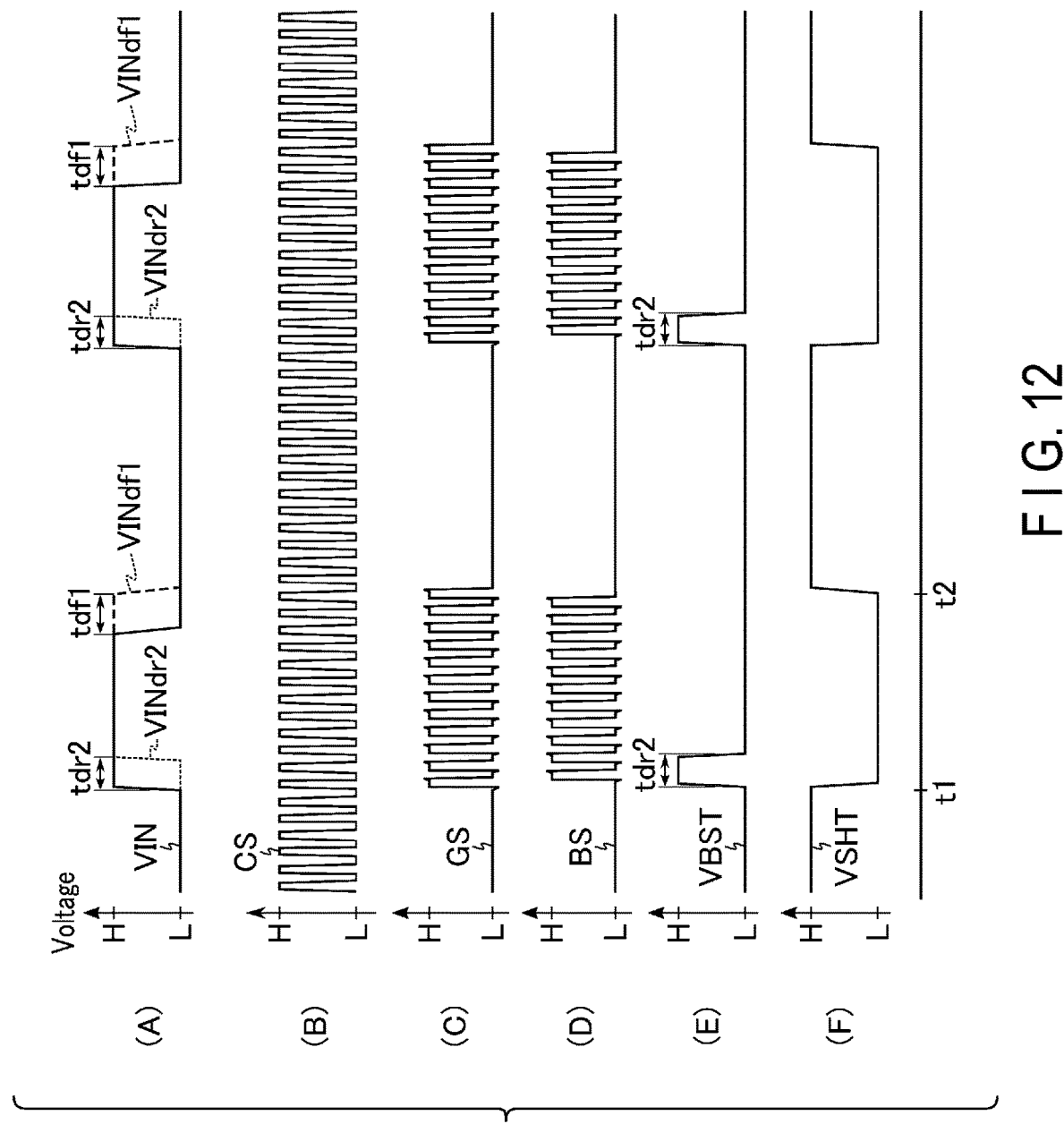
FIG. 12 is a timing chart showing an operation example of a modulation circuit provided in the communication device according to the second embodiment.

An operation example of the modulation circuit 30A will be described below with reference to FIG. 12. FIG. 12 is a timing chart showing an operation example of the modulation circuit 30A provided in the communication device 1A according to the second embodiment. (A) to (F) of FIG. 12 show the input signal VIN, the carrier signal CS, the positive phase side modulated signal VINP, the negative phase side modulated signal VINN, a boost signal VBST, and the shunt signal VSHT, respectively. In FIG. 12, t1 represents the timing at which the input signal VIN changes from "L" level to "H" level. In FIG. 12, t2 represents the timing at which the input signal VIN changes from "H" level to "L" level. Note that FIG. 12 exemplarily shows a case where the carrier signal CS in the high frequency band is output based on the input signal VIN of another channel. That is, a case where the input signal VIN to the modulation circuit 30A operates asynchronously with the carrier signal CS will be described.

If the input signal VIN is at "L" level, both the positive phase side modulated signal VINP of the modulation circuit 30A and the negative phase side modulated signal VINN are at "L" level.

If the input signal VIN changes from "L" level to "H" level, the boost signal VBST changes to "H" level, and the shunt signal VSHT changes to "L" level. Based on the change of the input signal VIN to "H" level, the modulation circuit 30A outputs the signals (VINP and VINN) in the high frequency band based on the carrier signal CS.

In addition, an input signal VINdr2 is delayed only by tdr2 and changes to "H" level. Based on the change of the input signal VINdr2 to "H" level, the boost signal VBST changes to "L" level.

If the input signal VIN changes from "H" level to "L" level, the input signal VINdf1 is delayed only by tdf1 and changes to "L" level. Based on the change of the input signal VINdf1 to "L" level, the modulation circuit 30A stops the output of the signals (VINP and VINN) in the high frequency band based on the carrier signal CS. Also, based on the change of the input signal VINdf1 to "L" level, the shunt signal VSHT changes to "H" level.

Note that in the second embodiment, the length of the boost period is "tdr2". That is, in the second embodiment, the boost period is decided by the delay time of the rise delay circuit RDC2.

The rest of the operation of the communication device 1A according to the second embodiment is the same as that of the communication device 1 according to the first embodiment.

<2-3> Effects of Second Embodiment

If "tON_RX+tON_IO" is smaller than "tOFF_RX+tOFF_IO", the pulse width of the output signal VO of the communication device 1 is wider than the pulse width of the input signal VIN to the communication device 1.

To address such a situation, the communication device 1A according to the second embodiment includes the modulation circuit 30A suitable for a digital isolator in which "tON_RX+tON_IO" becomes smaller than "tOFF_RX+tOFF_IO" (the pulse width becomes wider by signal transmission). More specifically, the modulation circuit 30A includes a delay circuit (fall delay circuit FDC1) that delays the timing at which the positive and negative phase side modulated signals of the OOK modulation signal stop the output of the signals based on the carrier signal CS if the input signal VIN changes from "H" level to "L" level. On the other hand, if the input signal VIN changes from "L" level to "H" level, the fall delay circuit FDC1 immediately outputs the positive and negative phase side modulated signals based on the carrier signal CS.

Hence, in the communication device 1A according to the second embodiment, the response time until the modulation circuit 30A outputs the signals based on the carrier signal CS if the input signal VIN changes from "L" level to "H" level is shorter than the response time until the modulation circuit 30A stops the output of the signals based on the carrier signal CS if the input signal VIN changes from "H" level to "L" level. The difference between the response times can be adjusted by the delay time tdf1 of the fall delay circuit FDC1.

As a result, in the communication device 1A according to the second embodiment, adjustment can be performed such that the pulse width of the input signal VIN and the pulse width of the output signal VO substantially equal. Hence, the communication device 1A according to the second embodiment can alleviate the limitation of the upper limit value of the signal transmission speed by the changes of the pulse widths of the input signal and the output signal and implement high-speed signal transmission with high-quality.

<3> Third Embodiment

A communication device 1B according to the third embodiment has a function similar to that of the communication device 1 according to the first embodiment. A primary-side device in the communication device 1B further has a function of, upon detecting the pulse of an input signal, generating the leading pulse of an OOK modulation signal independently of the phase of a carrier signal CS. As for details of the third embodiment, points different from the first and second embodiments will be described below.

<3-1> Configuration

FIG. 13 is a circuit diagram showing an example of the circuit configuration of an input modulation unit IMP provided in the communication device 1B according to the third embodiment. As shown in FIG. 13, the communication device 1B includes a modulation circuit 30B in place of the modulation circuit 30. The modulation circuit 30B has a configuration in which a buffer 301, an inverter 302, and rise delay circuit RDC1 are omitted, and rise delay circuits RDC3 and RDC4, a NOR circuit 310, an inverter 311, an AND circuit 312, an OR circuit 313, and a NOR circuit 314 are added in the modulation circuit 30 according to the first embodiment.

An input circuit 10 according to the third embodiment outputs an input signal VIN to each of an oscillator 20, rise delay circuits RDC2, RDC3, and RDC4, AND circuits 303, 304, and 305, and an inverter 306. The oscillator 20 according to the third embodiment outputs the carrier signal CS generated based on the input signal VIN to the NOR circuit 310.

The rise delay circuit RDC3 is a delay circuit that delays the rise of the signal VIN input from the input circuit 10 and outputs it. The delay time of the rise of the signal by the rise delay circuit RDC3 will be referred to as "tdr3" hereinafter. The input signal VIN delayed by the rise delay circuit RDC3 will be referred to as an "input signal VINdr3". The rise delay circuit RDC3 outputs the input signal VINdr3 based on the input signal VIN to the AND circuit 312.

The rise delay circuit RDC4 is a delay circuit that delays the rise of the signal VIN input from the input circuit 10 and outputs it. The delay time of the rise of the signal by the rise delay circuit RDC4 will be referred to as "tdr4" hereinafter. The input signal VIN delayed by the rise delay circuit RDC4 will be referred to as an "input signal VINdr4". The rise delay circuit RDC4 outputs the input signal VINdr4 based on the input signal VIN to the inverter 311. The inverter 311 then outputs the input signal VINdr4 with the inverted logic as a gate signal GS to each of the NOR circuit 310, the AND circuit 312, and the NOR circuit 314.

The NOR circuit 310 performs a NOR operation between the carrier signal CS input from the oscillator 20 and the gate signal GS input from the inverter 311. The NOR circuit 310 then outputs the operation result to each of the OR circuit 313 and the NOR circuit 314.

The AND circuit 312 performs an AND operation between the input signal VINdr3 input from the rise delay circuit RDC3 and the gate signal GS input from the inverter 311. The AND circuit 312 then outputs the operation result as a bit signal BS to the OR circuit 313.

The OR circuit 313 performs an OR operation between the output signal (operation result) of the NOR circuit 310 and the bit signal BS input from the AND circuit 312. The OR circuit 313 then outputs the operation result to the AND circuit 303.

The NOR circuit 314 performs a NOR operation between the output signal of the NOR circuit 310 and the gate signal GS input from the inverter 311. The NOR circuit 314 then outputs the operation result to the AND circuit 304.

The AND circuit 303 according to the third embodiment performs an AND operation between the output signal of the OR circuit 313 and the signal VIN input from the input circuit 10. The AND circuit 303 then outputs the operation result as a positive phase side modulated signal VINP to a transmitting circuit 40.

The AND circuit 304 according to the third embodiment performs an AND operation between the output signal of the NOR circuit 314 and the signal VIN input from the input circuit 10. The AND circuit 304 then outputs the operation result as a negative phase side modulated signal VINN to the transmitting circuit 40.

The rest of the configuration of the communication device 1B according to the third embodiment is the same as that of the communication device 1 according to the first embodiment.

<3-2> Operation

Figure 14:
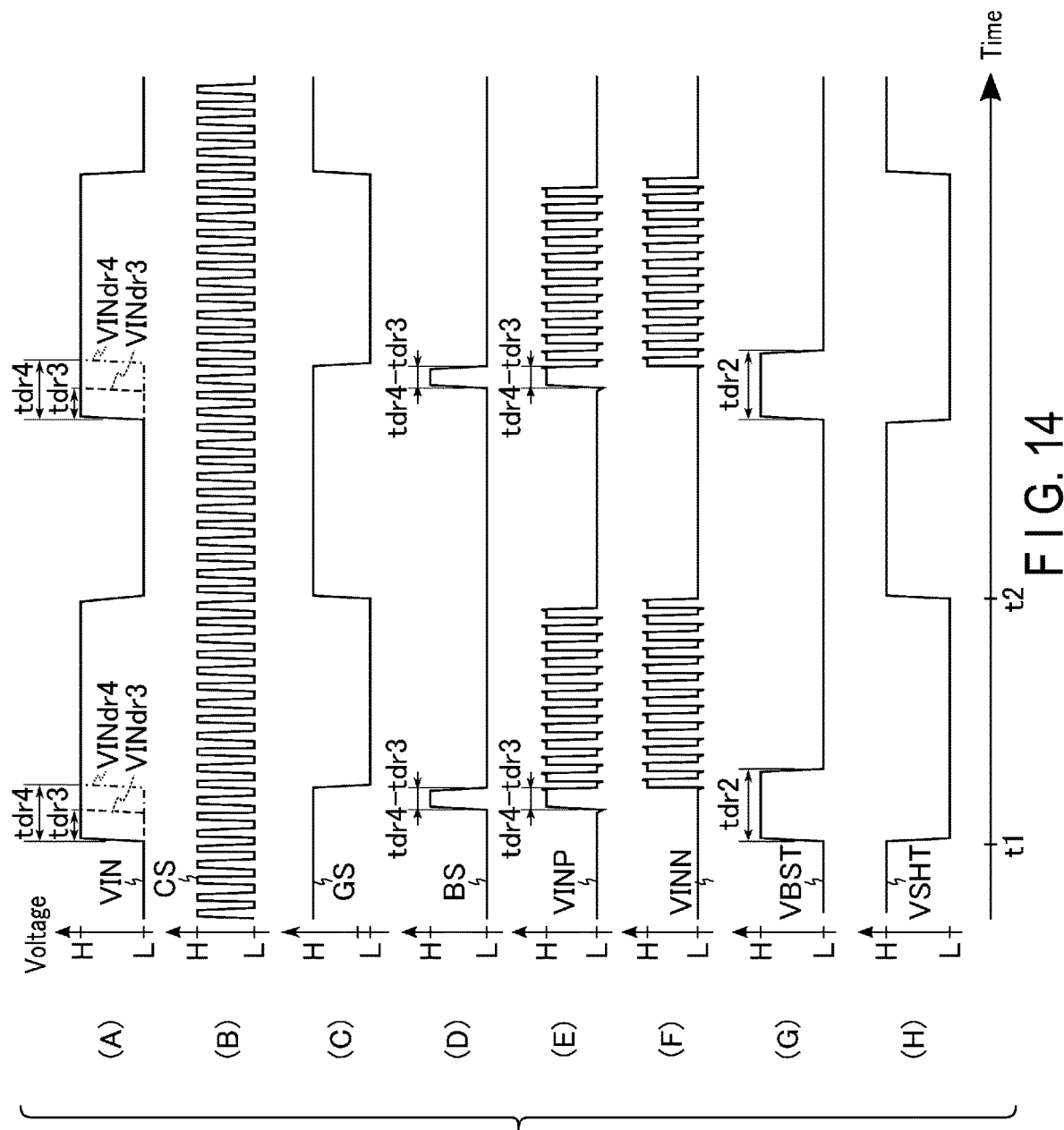
FIG. 14 is a timing chart showing an operation example of a modulation circuit provided in the communication device according to the third embodiment.

An operation example of the modulation circuit 30B will be described below with reference to FIG. 14. FIG. 14 is a timing chart showing an operation example of the modulation circuit 30B provided in the communication device 1B according to the third embodiment. (A) to (F) of FIG. 14 show the input signal VIN, the carrier signal CS, the gate signal GS, the bit signal BS, the positive phase side modulated signal VINP, the negative phase side modulated signal VINN, a boost signal VBST, and the shunt signal VSHT, respectively. In FIG. 14, t1 represents the timing at which the input signal VIN changes from "L" level to "H" level. In FIG. 14, t2 represents the timing at which the input signal VIN changes from "H" level to "L" level. Note that FIG. 14 exemplarily shows a case where the carrier signal CS in the high frequency band is output based on the input signal VIN of another channel. That is, a case where the input signal VIN to the modulation circuit 30B operates asynchronously with the carrier signal CS will be described.

If the input signal VIN is at "L" level, both the positive phase side modulated signal VINP of the modulation circuit 30B and the negative phase side modulated signal VINN are at "L" level. In addition, the gate signal GS is at "H" level, and the bit signal BS is at "L" level.

If the input signal VIN changes from "L" level to "H" level, the boost signal VBST changes to "H" level, and the shunt signal VSHT changes to "L" level. In addition, the input signals VINdr3 and VINdr4 are delayed only by tdr3 and tdr4 and change to "H" level. The bit signal BS is at "H" level in a period when the input signal VINdr3 is at "H" level, and the input signal VINdr4 is at "L" level. That is, the period when the bit signal BS is at "H" level corresponds to the difference between the delay time tdr3 of the rise delay circuit RDC3 and the delay time tdr4 of the rise delay circuit RDC4. In the period when the bit signal BS is at "H" level, the positive phase side modulated signal VINP is at "H" level. That is, the leading pulse width of the positive phase side modulated signal VINP is "tdr4−tdr3".

If the input signal VINdr4 changes from "L" level to "H" level, the gate signal GS changes from "H" level to "L" level. The modulation circuit 30B outputs the signals (VINP and VINN) in the high frequency band based on the carrier signal CS. More specifically, the carrier signal CS masked by the gate signal GS is output from the positive phase side modulated signal VINP. As the negative phase side modulated signal VINN, the carrier signal CS masked by the gate signal GS and inverted is output. The phases of the positive phase side modulated signal VINP and the negative phase side modulated signal VINN are opposite phases except the pulse signals at the start.

If the input signal VIN changes from "H" level to "L" level, the oscillator 20 stops the output of the carrier signal CS in the high frequency band, and the shunt signal VSHT changes to "H" level. Based on the change of the input signal VIN to "L" level, the modulation circuit 30B stops the output of the signals (VINP and VINN) in the high frequency band based on the carrier signal CS.

Note that in the third embodiment, the delay time tdr2 of the rise delay circuit RDC2 is longer than the delay time tdr4 of the rise delay circuit RDC4. Also, in the third embodiment, the length of the boost period is "tdr4−tdr3". In the third embodiment, the boost period is decided by the delay times of the rise delay circuits RDC3 and RDC4.

The rest of the operation of the communication device 1B according to the third embodiment is the same as that of the communication device 1 according to the first embodiment.

<3-3> Effects of Third Embodiment

If a plurality of channels share one oscillator 20, each modulation circuit 30B sometimes operates asynchronously with the carrier signal CS. In the modulation circuit 30B that operates asynchronously with the carrier signal CS, the transition timing of the input signal VIN and the transition timing of the carrier signal CS do not match. In this case, the waveform of the leading pulse of the OOK modulation signal can change in accordance with the phase of the carrier signal CS at the timing when the pulse of the input signal VIN is input. Similarly, the waveform of the final pulse of the OOK modulation signal can change in accordance with the phase of the carrier signal CS at the timing when the pulse of the input signal VIN stops. That is, if the input signal VIN and the oscillator 20 operate asynchronously, the leading pulse and the final pulse of the OOK modulation signal have random pulse widths.

As described in the first embodiment, a rise of the full-wave rectifier circuit 62 is determined by the signal of the full-wave rectifier waveform, and a fall of the full-wave rectifier circuit 62 is determined by a bias current of no signal. For this reason, the final pulse has no effect on the fall of the full-wave rectifier circuit 62. On the other hand, if the leading pulse of the OOK modulation signal has a random pulse width, the waveform of the output voltage of a receive circuit 60 may change due to the influence on the response of the fall in the full-wave rectifier circuit 62, and a random jitter may occur.

Hence, the communication device 1B according to the third embodiment has a function of stabilizing the leading pulse of the OOK modulation signal using a delay circuit. More specifically, the modulation circuit 30B according to the third embodiment generates the bit signal BS using the difference of the delay time between the rise delay circuits RDC3 and RDC4. The modulation circuit 30B then generates the leading pulse of the OOK modulation signal based on the bit signal BS. After that, based on the gate signal GS, the modulation circuit 30B generates the pulse in the high frequency band based on the carrier signal CS.

As a result, in the communication device 1B according to the third embodiment, the modulation circuit 30B can output a stable leading pulse independently of the phase difference between the carrier signal CS and the input signal VIN. Hence, the communication device 1B according to the third embodiment can suppress the occurrence of a jitter in the output of the receive circuit 60.

Also, in the communication device 1B according to the third embodiment, the output time of the OOK modulation signal is shortened by a time corresponding to the delay time tdr3 of the rise delay circuit RDC3. Hence, in a case where the pulse width becomes wide by signal transmission, the communication device 1B according to the third embodiment adjusts the delay time tdr3 of the rise delay circuit RDC3, thereby adjusting the pulse width of the input signal and the pulse width of the output signal such that these substantially equal. Hence, the communication device 1B according to the third embodiment can alleviate the limitation of the upper limit value of the signal transmission speed by the changes of the pulse widths of the input signal and the output signal and implement high-speed signal transmission with high-quality.

<4> Fourth Embodiment

A communication device 1C according to the fourth embodiment has a function similar to that of the communication device 1A according to the second embodiment. A primary-side device in the communication device 1C further has a function of, upon detecting the pulse of an input signal, generating the leading pulse of an OOK modulation signal independently of the phase of a carrier signal CS, as in the third embodiment. As for details of the fourth embodiment, points different from the first to third embodiments will be described below.

<4-1> Configuration

FIG. 15 is a circuit diagram showing an example of the circuit configuration of an input modulation unit IMP provided in the communication device 1C according to the fourth embodiment. As shown in FIG. 15, the communication device 1C includes a modulation circuit 30C in place of the modulation circuit 30. The modulation circuit 30C has a configuration in which a rise delay circuit RDC3 is omitted, and a fall delay circuit FDC2 is added in the modulation circuit 30B according to the third embodiment.

An input circuit 10 according to the fourth embodiment outputs an input signal VIN to each of rise delay circuits RDC2 and RDC4, the fall delay circuit FDC2, and AND circuits 305 and 312.

The fall delay circuit FDC2 is a delay circuit that delays the fall of the signal VIN input from the input circuit 10 and outputs it. The delay time of the fall of the signal by the fall delay circuit FDC2 will be referred to as "tdf2" hereinafter. The input signal VIN delayed by the fall delay circuit FDC2 will be referred to as an "input signal VINdf2". The fall delay circuit FDC2 outputs the input signal VINdf2 based on the input signal VIN to each of an oscillator 20, an AND circuit 303, an AND circuit 304, and an inverter 306. The oscillator 20 according to the fourth embodiment outputs the carrier signal CS generated based on the input signal VINdf2 input from the fall delay circuit FDC2 to a NOR circuit 310. The AND circuit 312 according to the fourth embodiment performs an AND operation between the signal VIN input from the input circuit 10 and a gate signal GS input from an inverter 311. The AND circuit 312 then outputs the operation result as a bit signal BS to an OR circuit 313.

The AND circuit 303 according to the fourth embodiment performs an AND operation between the output signal of the OR circuit 313 and the input signal VINdf2 input from the fall delay circuit FDC2. The AND circuit 303 then outputs the operation result as a positive phase side modulated signal VINP to a transmitting circuit 40.

The AND circuit 304 according to the fourth embodiment performs an AND operation between the output signal of a NOR circuit 314 and the input signal VINdf2 input from the fall delay circuit FDC2. The AND circuit 304 then outputs the operation result as a negative phase side modulated signal VINN to the transmitting circuit 40.

The inverter 306 according to the fourth embodiment then outputs the input signal VINdf2 with the inverted logic as a shunt signal VSHT to the transmitting circuit 40.

The rest of the configuration of the communication device 1C according to the fourth embodiment is the same as that of the communication device 1B according to the third embodiment.

<4-2> Operation

An operation example of the modulation circuit 30C will be described below with reference to FIG. 16. FIG. 16 is a timing chart showing an operation example of the modulation circuit 30C provided in the communication device 1C according to the fourth embodiment. (A) to (F) of FIG. 16 show the input signal VIN, the carrier signal CS, the gate signal GS, the bit signal BS, the positive phase side modulated signal VINP, the negative phase side modulated signal VINN, a boost signal VBST, and the shunt signal VSHT, respectively. In FIG. 16, t1 represents the timing at which the input signal VIN changes from "L" level to "H" level. In FIG. 16, t2 represents the timing at which the input signal VIN changes from "H" level to "L" level. Note that FIG. 16 exemplarily shows a case where the carrier signal CS in the high frequency band is output based on the input signal VIN of another channel. That is, a case where the input signal VIN to the modulation circuit 30C operates asynchronously with the carrier signal CS will be described.

If the input signal VIN is at "L" level, both the positive phase side modulated signal VINP of the modulation circuit 30C and the negative phase side modulated signal VINN are at "L" level. In addition, the gate signal GS is at "H" level, and the bit signal BS is at "L" level.

If the input signal VIN changes from "L" level to "H" level, the boost signal VBST changes to "H" level, and the shunt signal VSHT changes to "L" level. In addition, an input signal VINdr4 is delayed only by tdr4 and changes to "H" level. The bit signal BS is at "H" level in a period when the input signal VIN is at "H" level, and the input signal VINdr4 is at "L" level. That is, the period when the bit signal BS is at "H" level corresponds to the delay time tdr4 of the rise delay circuit RDC4. In the period when the bit signal BS is at "H" level, the positive phase side modulated signal VINP is at "H" level. That is, the leading pulse width of the positive phase side modulated signal VINP is "tdr4".

If the input signal VINdr4 changes from "L" level to "H" level, the gate signal GS changes from "H" level to "L" level. The modulation circuit 30C outputs the signals (VINP and VINN) in the high frequency band based on the carrier signal CS.

If the input signal VIN changes from "H" level to "L" level, the input signal VINdf2 is delayed only by tdf2 and changes to "L" level. Based on the change of the input signal VINdf2 to "L" level, the modulation circuit 30C stops the output of the signals (VINP and VINN) in the high frequency band based on the carrier signal CS. Also, based on the change of the input signal VINdf2 to "L" level, the shunt signal VSHT changes to "H" level. In this example, even if the input signal VINdf2 changes to "L" level, the carrier signal CS in the high frequency band is maintained. However, if all the remaining input signals VIN are at "L" level, the output of the carrier signal CS is stopped.

Note that in the fourth embodiment, the length of the boost period is "tdr2". That is, in the fourth embodiment, the boost period is decided by the delay time of the rise delay circuit RDC2.

The rest of the operation of the communication device 1C according to the fourth embodiment is the same as that of the communication device 1B according to the third embodiment.

<4-3> Effects of Fourth Embodiment

The communication device 1C according to the fourth embodiment has a function of stabilizing the leading pulse of the OOK modulation signal using a delay circuit different from the third embodiment. More specifically, the modulation circuit 30C according to the fourth embodiment generates the bit signal BS using the delay time tdr4 between the rise delay circuit RDC4. The modulation circuit 30C then generates the leading pulse of the OOK modulation signal based on the bit signal BS. After that, based on the gate signal GS, the modulation circuit 30C generates the pulse in the high frequency band based on the carrier signal CS.

As a result, in the communication device 1C according to the fourth embodiment, the modulation circuit 30C can output a stable leading pulse independently of the phase difference between the carrier signal CS and the input signal VIN. Hence, the communication device 1C according to the fourth embodiment can suppress the occurrence of a jitter in the output of a receive circuit 60.

Also, in the communication device 1C according to the fourth embodiment, the output time of the OOK modulation signal is shortened by a time corresponding to the delay time tdf2 of the fall delay circuit FDC2. Hence, in a case where the pulse width becomes narrow by signal transmission, the communication device 1C according to the fourth embodiment adjusts the delay time tdf2 of the fall delay circuit FDC2, thereby adjusting the pulse width of the input signal and the pulse width of the output signal such that these substantially equal. Hence, the communication device 1C according to the fourth embodiment can alleviate the limitation of the upper limit value of the signal transmission speed by the changes of the pulse widths of the input signal and the output signal and implement high-speed signal transmission with high-quality.

<5> Fifth Embodiment

A communication device 1D according to the fifth embodiment concerns a case where a carrier signal CS that changes between channels is used in a communication device 1 formed by multiple channels. As for details of the fifth embodiment, points different from the first to fourth embodiments will be described below.

<5-1> Configuration

FIG. 17 is a block diagram showing an example of the configuration of the communication device 1D according to the fifth embodiment. FIG. 17 shows the communication device 1D formed by two channels. As shown in FIG. 17, the communication device 1D has a configuration in which the oscillator 20 is replaced with an oscillator 20A in the communication device 1 according to the first embodiment. The oscillator 20A generates carrier signals CS1 and CS2 of different phases in a period when at least one of input signals VIN<1> and VIN<2> is at "H" level, and stops the generation of the carrier signals CS1 and CS2 in a period when both the input signals VIN<1> and VIN<2> are at "L" level. The oscillator 20A then outputs the generated carrier signals CS1 and CS2 to each of modulation circuits 30-1 and 30-2. In this case, the modulation circuit 30 of each channel generates an OOK modulation signal using the carrier signal CS of a different phase.

(Configuration of Oscillator 20A)

FIG. 18 is a circuit diagram showing an example of the circuit configuration of the oscillator 20A provided in the communication device 1D according to the fifth embodiment. As shown in FIG. 18, the oscillator 20A includes, for example, an OR circuit 80, a NAND circuit 81, inverters 82 to 84, a buffer 85, an inverter 86, and nodes N40 to N42.

The OR circuit 80 outputs "H" level signal to the NAND circuit 81 when at least one of the input signal VIN<1> input from an input circuit 10-1 and the input signal VIN<2> input from an input circuit 10-2 is "H" level. The NAND circuit 81 performs a NAND operation between the output signal of the OR circuit 80 and the voltage of the node N42 (the output signal of the inverter 83). The NAND circuit 81 then outputs the operation result to the inverter 82 via the node N40. The inverter 82 inverts the logic of the output signal of the NAND circuit 81 and outputs the signal to the inverter 83 via the node N41. The inverter 83 inverts the logic of the output signal of the NAND circuit 81 and outputs the signal to each of the inverter 84 and the NAND circuit 81 via the node N42. The inverter 84 outputs a signal obtained by inverting the logic of the signal input to the node N42. The buffer 85 buffers the signal input to the node N41, and outputs a signal having the logic of the signal input to the node N41. The inverter 86 outputs a signal obtained by inverting the logic of the signal input to the node N40. The outputs of the inverter 84, the buffer 85, and the inverter 86 correspond to the carrier signals CS1, CS2, and CS3. Note that FIG. 17 exemplarily shows a case where the carrier signals CS1 and CS2 are supplied to the modulation circuits 30-1 and 30-2, respectively. However, the carrier signal CS3 may be used in place of the carrier signal CS1 or CS2. If the communication device 1D is formed by three or more channels, each of the carrier signals CS1 to CS3 may be supplied to the associated modulation circuit 30.

In the oscillator 20A, the set of the NAND circuit 81, the inverter 82, and the inverter 83 corresponds to a ring oscillator. If both the input signals VIN<1> and VIN<2> are at "L" level, the ring oscillator of the oscillator 20A does not oscillate. For this reason, the outputs of the inverter 84, the buffer 85, and the inverter 86 are at "L" level. If at least one of the input signals VIN<1> and VIN<2> is at "H" level, the ring oscillator of the oscillator 20A oscillates. At this time, the inverter 84, the buffer 85, and the inverter 86 output the carrier signals CS1, CS2, and CS3 in the high frequency band, respectively. The phases of the carrier signals CS1 to CS3 are different because the nodes to extract the signals are different from each other.

Note that a case where the carrier signals CS1 and CS2 are output to the modulation circuits 30-1 and 30-2, respectively, has been described with reference to FIG. 17. However, the present invention is not limited to this. In the communication device 1D, using the carrier signals CS of different phases between the plurality of channels suffices.

Also, the communication device 1D may be formed by N (N is an integer of 2 or more) channels. Since the input signal VIN and the carrier signal CS are permitted to be asynchronous in each channel, the communication device 1D need only include one oscillator 20A shared by the first to Nth channels. In this case, the oscillator 20A generates the plurality of carrier signals CS of different phases in a period when at least one of input signals VIN<1> to VIN<N> is at "H" level, and stops the generation of the carrier signals CS in a period when all the input signals VIN<1> to VIN<N> are at "L" level. The modulation circuits 30-1 to 30-N and the carrier signals CS of different phases may not be assigned in a one-to-one correspondence. In the fifth embodiment, the carrier signals CS having the same phase may be input to the plurality of modulation circuits 30.

<5-2> Effects of Fifth Embodiment

In the communication device capable of inputting N-bit signals, N modulation circuits 30 operate synchronously, and synchronized carrier signals flow to N insulation elements 50. As a result, EMI radiated from the modulation circuits 30 and the insulation elements 50 is also N-fold. In the first to fourth embodiments, the signal (pulse) output by each modulation circuit 30 is completely synchronized with the carrier signal CS. As a method of improving the EMI performance, changing the driving phase between the plurality of insulation elements 50 can be considered.

Hence, the communication device 1D according to the fifth embodiment includes the oscillator 20A capable of generating the plurality of carrier signals CS. Accordingly, the communication device 1D according to the fifth embodiment can supply the carrier signals CS of different phases to the modulation circuits 30. As a result, the communication device 1D according to the fifth embodiment can improve the harmonic EMI performance. Note that in the fifth embodiment, a case where the oscillator 20A generates the three carrier signals CS of different phases has been exemplified. However, the present invention is not limited to this. The oscillator 20A need only be configured to generate two or more carrier signals CS of different phases.

<6> Other Embodiments (Typical Example of Rise Delay Circuit RDC)

A typical example of a rise delay circuit RDC will be described below.

FIG. 19 is a circuit diagram showing an example of the circuit configuration of the rise delay circuit RDC. As shown in FIG. 19, the rise delay circuit RDC includes, for example, an inverter 90, a buffer 91, and a NOR circuit 92. The inverter 90 inverts an input signal to the rise delay circuit RDC and outputs it to each of the buffer 91 and the NOR circuit 92. The buffer 91 delays the output signal of the inverter 90 and outputs it to the NOR circuit 92. The NOR circuit 92 performs a NOR operation between the output signal of the inverter 90 and the output signal of the inverter 90 delayed by the buffer 91. The NOR circuit 92 then outputs the operation result as the output signal of the rise delay circuit RDC. Note that the buffer 91 is, for example, an inverter chain or a current limiting type inverter chain. Also, the rise delay circuit RDC may include, as the buffer 91, a capacitor and a current source, and use a delay decided by charging/discharging the capacitor by the current source.

FIG. 20 is a timing chart showing an example of the characteristic of the rise delay circuit RDC. As shown in FIG. 20, if the input signal to the rise delay circuit RDC maintains "L" level, a signal of "H" level is input from each of the inverter 90 and the buffer 91 to the NOR circuit 92. For this reason, the output signal of the NOR circuit 92 (the output signal of the rise delay circuit RDC) is at "L" level.

If the input signal transitions from "L" level to "H" level, a signal of "L" level is immediately input from the inverter 90 to the NOR circuit 92. On the other hand, a signal of "L" level is input from the buffer 91 with a delay. For this reason, the output signal of the NOR circuit 92 (the output signal of the rise delay circuit RDC) maintains "L" level during a delay time tdr by the buffer 91 and then transitions to "H" level.

If the input signal transitions from "H" level to "L" level, a signal of "H" level is immediately input from the inverter 90 to the NOR circuit 92. For this reason, the output signal of the NOR circuit 92 (the output signal of the rise delay circuit RDC) immediately transitions from "H" level to "L" level. After that, if the delay time tdr of the buffer 91 elapses, a signal of "H" level is input from each of the inverter 90 and the buffer 91 to the NOR circuit 92.

(Typical Example of Fall Delay Circuit FDC)

A typical example of a fall delay circuit FDC will be described below. FIG. 21 is a circuit diagram showing an example of the circuit configuration of the fall delay circuit FDC. As shown in FIG. 21, the fall delay circuit FDC includes, for example, an inverter 93, a buffer 94, and a NAND circuit 95. The inverter 93 inverts an input signal to the fall delay circuit FDC and outputs it to each of the buffer 94 and the NAND circuit 95. The buffer 94 delays the output signal of the inverter 93 and outputs it to the NAND circuit 95. The NAND circuit 95 performs a NAND operation between the output signal of the inverter 93 and the output signal of the inverter 93 delayed by the buffer 94. The NAND circuit 95 then outputs the operation result as the output signal of the fall delay circuit FDC. Note that the buffer 94 is, for example, an inverter chain or a current limiting type inverter chain. Also, the fall delay circuit FDC may include, as the buffer 94, a capacitor and a current source, and use a delay decided by charging/discharging the capacitor by the current source.

FIG. 22 is a timing chart showing an example of the characteristic of the fall delay circuit FDC. As shown in FIG. 22, if the input signal to the fall delay circuit FDC maintains "L" level, a signal of "H" level is input from each of the inverter 93 and the buffer 94 to the NAND circuit 95. For this reason, the output signal of the NAND circuit 95 (the output signal of the fall delay circuit FDC) is at "L" level.

If the input signal transitions from "L" level to "H" level, a signal of "L" level is immediately input from the inverter 93 to the NAND circuit 95. For this reason, the output signal of the NAND circuit 95 (the output signal of the fall delay circuit FDC) immediately transitions from "L" level to "H" level. After that, if a delay time tdf of the buffer 94 elapses, a signal of "L" level is input from each of the inverter 93 and the buffer 94 to the NAND circuit 95.

If the input signal transitions from "H" level to "L" level, a signal of "H" level is immediately input from the inverter 93 to the NAND circuit 95. On the other hand, a signal of "H" level is input from the buffer 94 with a delay. For this reason, the output signal of the NAND circuit 95 (the output signal of the fall delay circuit FDC) maintains "H" level during the delay time tdf by the buffer 94 and then transitions to "L" level.

(First Modification of Insulation Element 50)

In the first embodiment, a case where the insulation element 50 is formed by isolation transformers using a magnetic field as a transmission medium has been exemplified. However, the present invention is not limited to this. The communication device 1 may include the insulation element 50 using an electric field as a transmission medium. If an electric field is used as a transmission medium, an insulating capacitor with metal plates formed at the two ends of an insulating layer is used.

FIG. 23 is a circuit diagram showing an example of the circuit configuration of a communication device 1E according to the first modification of the first embodiment. As shown in FIG. 23, the communication device 1E includes an insulation element 50A in place of the insulation element 50. The insulation element 50A includes insulating capacitor parts 53 and 54. The insulating capacitor part 53 is mounted on the first substrate SUB1 and includes insulating capacitors 531 and 532. The insulating capacitor part 54 is mounted on the second substrate SUB2 and includes insulating capacitors 541 and 542.

One electrode of the insulating capacitor 531 is connected to the negative phase side output terminal (−) of the transmitting circuit 40. One electrode of the insulating capacitor 532 is connected to the positive phase side output terminal (+) of the transmitting circuit 40. One electrode of the insulating capacitor 541 is connected to the positive phase side input terminal (+) of the amplifier circuit 61. One electrode of the insulating capacitor 542 is connected to the negative phase side input terminal (−) of the amplifier circuit 61. The other electrode of the insulating capacitor 531 and the other electrode of the insulating capacitor 541 are connected via, for example, a wire bonding. The other electrode of the insulating capacitor 532 and the other electrode of the insulating capacitor 542 are connected via, for example, a wire bonding. The insulating layers included in the insulating capacitors 531, 532, 541, and 542 may each be made of, for example, an oxide film or polyimide.

If the insulation element 50A is formed by the insulating capacitors, the transmitting circuit 40 supplies differential voltages based on a modulated signal to the insulation element 50A. Thus, the insulation element 50A can transmit signals from the transmitting circuit 40 to the amplifier circuit 61 by electric field coupling of the insulating capacitors 531, 532, 541, and 542.

Note that in the first modification of the first embodiment, a case where an insulating capacitor part is provided on each of the first substrate SUB1 and the second substrate SUB2 has been exemplified. However, the present invention is not limited to this. The insulating capacitor part may be mounted on one of the first substrate SUB1 and the second substrate SUB2 or may be mounted on both the first substrate SUB1 and the second substrate SUB2. The configuration described in the first modification of the first embodiment may be combined with another embodiment or modification.

(Second Modification of Insulation Element 50)

In the first embodiment, a case where the insulation element 50 is provided on both the first substrate SUB1 and the second substrate SUB2 has been exemplified. However, the present invention is not limited to this. In the communication device 1, the insulation element 50 may be provided on a substrate different from the first substrate SUB1 and the second substrate SUB2.

Figure 24:
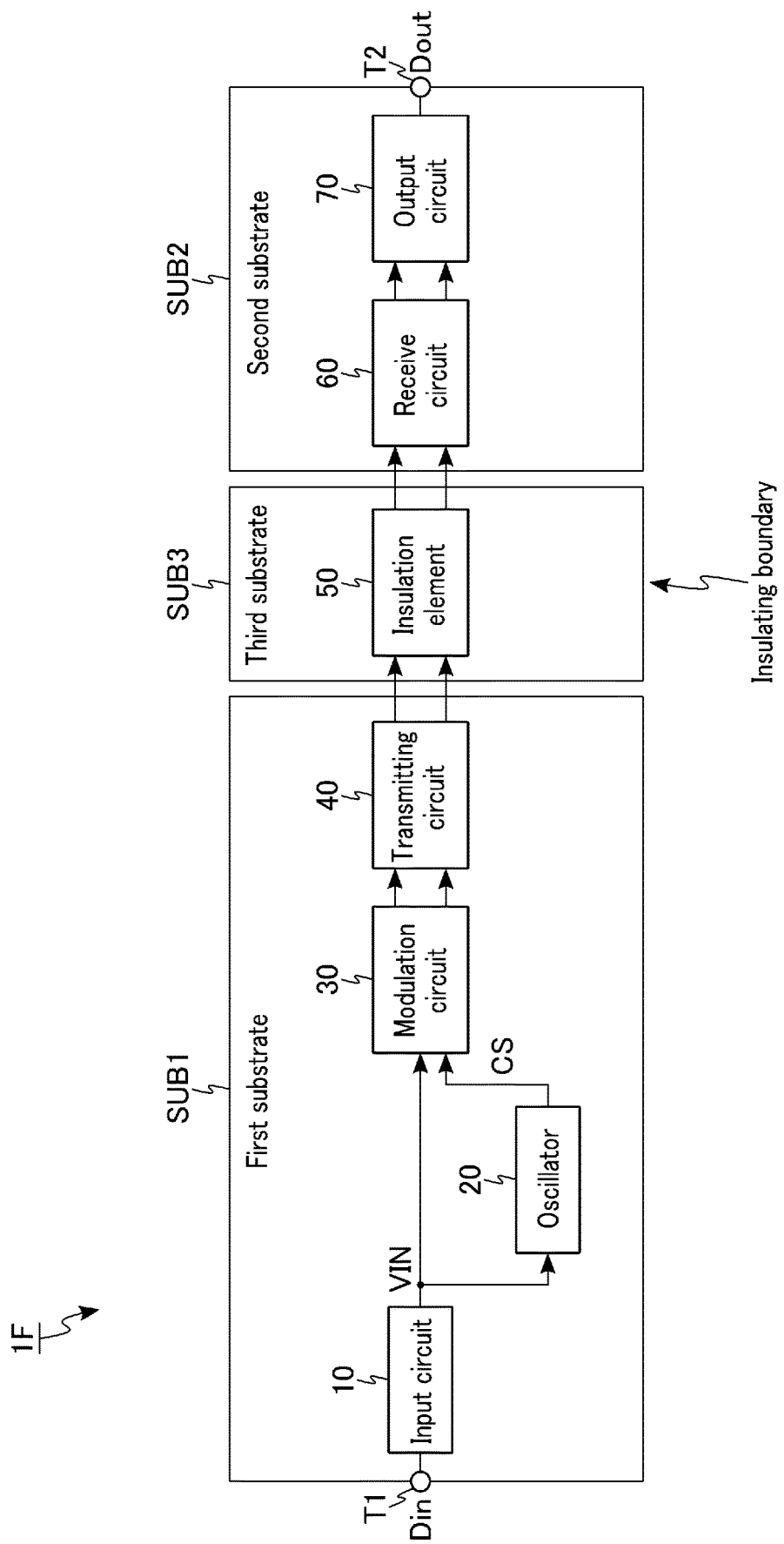
FIG. 24 is a block diagram showing an example of the configuration of a communication device according to the second modification of the first embodiment.

FIG. 24 is a block diagram showing an example of the configuration of a communication device 1F according to the second modification of the first embodiment. As shown in FIG. 24, the communication device 1F has a configuration in which a third substrate SUB3 is added to the communication device 1. The third substrate SUB3 is electrically connected to one of the first substrate SUB1 and the second substrate SUB2. The insulation element 50 is mounted on the third substrate SUB3. In this case, the transmitting circuit 40 mounted on the first substrate SUB1 and the insulation element 50 mounted on the third substrate SUB3 are connected by, for example, wire bonding. Similarly, the receive circuit 60 mounted on the second substrate SUB2 and the insulation element 50 mounted on the third substrate SUB3 are connected by, for example, wire bonding.

The chip cost of a step of forming the insulation element 50 is high because a step of forming a thick oxide film is included. On the other hand, in the second modification of the first embodiment, since the insulation element 50 is formed on the third substrate SUB3, the manufacturing cost can be suppressed as compared to a case where the insulation element 50 is formed on both the first substrate SUB1 and the second substrate SUB2. The configuration described in the second modification of the first embodiment may be combined with another embodiment or modification.

Other Modifications

The above-described embodiments may be combined in a possible range. The fifth embodiment may be combined with any one of the first to fourth embodiments.

In the above-described embodiments, a case where no signal is transmitted to the insulation element 50 if the input signal VIN is at "L" level, and the carrier signal CS is transmitted to the insulation element 50 if the input signal VIN is at "H" level has been exemplified. However, the present invention is not limited to this. The communication device 1 may be configured to transmit no signal to the insulation element 50 if the input signal VIN is at "H" level and transmit the carrier signal CS to the insulation element 50 if the input signal VIN is at "L" level. In the transmitting circuit 40, the boost circuit BC may be configured to increase the charge speed of the capacitor CC if the boost signal VBST is at "L" level, and the shunt circuit SC may be configured to discharge the charges accumulated in the capacitor CC if the shunt signal VSHT is at "L" level.

In the third embodiment, a case where the modulation circuit 30B is formed by three inverter circuits, four AND circuits, one OR circuit, and two NOR circuits has been exemplified. However, the present invention is not limited to this. The modulation circuit 30B may have another circuit configuration if it can perform the same logic output as described in the third embodiment. Similarly, in the fourth embodiment, the modulation circuit 30C may have another circuit configuration if it can perform the same logic output as described in the fourth embodiment.

In this specification, a configuration in which an insulating device (an isolation transformer or an insulating capacitor) is provided on each of the first substrate SUB1 and the second substrate SUB2 may be called a "double insulation method". In this specification, a configuration in which an insulating device (an isolation transformer or an insulating capacitor) is provided on one of the first substrate SUB1 and the second substrate SUB2 may be called a "single insulation method". In this specification, each of the buffers 85, 91, 94, and 301 may be called a "delay element".

In this specification, a voltage of "H" level corresponds to a voltage equal to or higher than a threshold when determining data by a binary value. A voltage of "L" level corresponds to a voltage lower than the threshold when determining data by a binary value. In this specification, "connected" indicates "electrically connected" and does not exclude, for example, intervening another element. "Electrically connected" may be done with intervention of an insulator if the same operation as that of electrically connected elements can be performed. The input circuit 10 may be called an "input buffer circuit". The output circuit 70 may be called an "output buffer circuit".

In this specification, "conductivity type" corresponds to "n-type" or "p-type". For example, a transistor of a first conductivity type corresponds to one of an NMOS transistor and a PMOS transistor, and a transistor of a second conductivity type corresponds to the other of an NMOS transistor and a PMOS transistor. One end and the other end may be called a "first end" and a "second end". A ground node may be called a power supply node. One end of a current source corresponds to one of an input terminal and an output terminal, and the other end of the current source corresponds to the other of an input terminal and an output terminal. In the above-described embodiments, a current source may be formed by one transistor, a plurality of transistors, or a current mirror circuit including two transistors.

In this specification, in a case of a planar MOSFET, the size of the transistor is compared using, for example, a gate width. In this specification, in a case of a FinFET, the size of the transistor is compared using, for example, the number of fins. In this specification, in a case of a transistor having a Nanosheet structure, the size of the transistor is compared using, for example, the number of layers in a Nanosheet that is a semiconductor layer.

Note that some or all of the above-described embodiments can also be described like the following supplementary notes, but are not limited to the following description.

Supplementary Note 1

A communication device comprising:

a first substrate including an oscillator and a first modulation circuit;

a second substrate insulated from the first substrate and including a first receive circuit and a first output circuit; and a first insulation element connected between the first modulation circuit and the first receive circuit, wherein the oscillator outputs a carrier signal in a high frequency band, the first modulation circuit includes at least one delay circuit, outputs a first modulated signal based on the carrier signal if a first input signal input from an outside has a first logic level, and using the at least one delay circuit, adjusts a length of a period to output the first modulated signal shorter or longer than a period when the first input signal has the first logic level, the first receive circuit receives a first electrical signal based on the first modulated signal via the first insulation element and demodulates the first electrical signal, and the first output circuit outputs, to the outside, a first output signal based on the first electrical signal demodulated by the first receive circuit.

Supplementary Note 2

The communication device of Supplementary Note 1, wherein a length of a period when the first output signal has the first logic level substantially equals a length of the period when the first input signal has the first logic level.

Supplementary Note 3

The communication device of Supplementary Note 1 or 2, wherein
the first modulation circuit includes a first logic circuit, and the at least one delay circuit includes a first delay circuit to which a signal based on the first input signal is input,
if the input signal transitions from a second logic level to the first logic level, an output signal of the first delay circuit is delayed by a first time and then transitions from the second logic level to the first logic level,
if the input signal transitions from the first logic level to the second logic level, the output signal of the delay circuit immediately transitions from the first logic level to the second logic level, and
the first logic circuit outputs, as the first modulated signal, a result of an AND operation between the output signal of the first delay circuit and the carrier signal.

Supplementary Note 4

The communication device of Supplementary Note 1 or 2, wherein
the first modulation circuit includes a second logic circuit, and the at least one delay circuit includes a second delay circuit and a third delay circuit, to which a signal based on the first input signal is input,
if the input signal transitions from a second logic level to the first logic level, an output signal of the second delay circuit is delayed by a second time and then transitions from the second logic level to the first logic level,
if the input signal transitions from the first logic level to the second logic level, the output signal of the second delay circuit immediately transitions from the first logic level to the second logic level,
if the input signal transitions from the second logic level to the first logic level, an output signal of the third delay circuit is delayed by a third time and then transitions from the second logic level to the first logic level,
if the input signal transitions from the first logic level to the second logic level, the output signal of the third delay circuit immediately transitions from the first logic level to the second logic level,
the second logic circuit outputs, as the first modulated signal, a result of an AND operation between the signal based on the first input signal and a signal based on the carrier signal, and
before the first modulated signal is output, the first modulation circuit outputs a signal of the first logic level having a length based on a difference between the second time and the third time.

Supplementary Note 5

The communication device of Supplementary Note 3 or 4, wherein
a length of a period when the first modulation circuit outputs the first modulated signal is shorter than the period when the first output signal has the first logic level.

Supplementary Note 6

The communication device of Supplementary Note 1 or 2, wherein
the first modulation circuit includes a third logic circuit, and the at least one delay circuit includes a fourth delay circuit to which a signal based on the first input signal is input,
if the input signal transitions from a second logic level to the first logic level, an output signal of the fourth delay circuit immediately transitions from the second logic level to the first logic level,
if the input signal transitions from the first logic level to the second logic level, the output signal of the fourth delay circuit is delayed by a fourth time and then transitions from the first logic level to the second logic level, and
the third logic circuit outputs, as the first modulated signal, a result of an AND operation between the output signal of the fourth delay circuit and the carrier signal.

Supplementary Note 7

The communication device of Supplementary Note 1 or 2, wherein
the first modulation circuit includes a fourth logic circuit, and the at least one delay circuit includes a fifth delay circuit and a sixth delay circuit, to which a signal based on the first input signal is input,
if the input signal transitions from a second logic level to the first logic level, an output signal of the fifth delay circuit is delayed by a fifth time and then transitions from the second logic level to the first logic level,
if the input signal transitions from the first logic level to the second logic level, the output signal of the fifth delay circuit immediately transitions from the first logic level to the second logic level,
if the input signal transitions from the second logic level to the first logic level, an output signal of the sixth delay circuit immediately transitions from the second logic level to the first logic level,
if the input signal transitions from the first logic level to the second logic level, the output signal of the sixth delay circuit is delayed by a sixth time and then transitions from the first logic level to the second logic level,
the fourth logic circuit outputs, as the first modulated signal, a result of an AND operation between the output signal of the sixth delay circuit and a signal based on the carrier signal, and
before the first modulated signal is output, the first modulation circuit outputs a signal of the first logic level having a length based on the fifth time.

Supplementary Note 8

The communication device of Supplementary Note 6 or 7, wherein
a length of a period when the first modulation circuit outputs the first modulated signal is longer than the period when the first output signal has the first logic level.

Supplementary Note 9

The communication device of any one of Supplementary Notes 1 to 8, wherein
the first substrate further includes a first transmitting circuit connected between the first modulation circuit and the first insulation element, the first transmitting circuit includes a first capacitor, a second capacitor, a third capacitor, a first inverter circuit to which the first modulated signal is input, a second inverter circuit to which an inverted signal of the first modulated signal is input, a first transistor and a first resistance, which are connected in parallel between an output terminal of the first inverter circuit and one electrode of the first capacitor, and a second transistor and a second resistance, which are connected in parallel between an output terminal of the second inverter circuit and one electrode of the second capacitor, one electrode of the third capacitor is connected to the other electrode of the first capacitor, the other electrode of the third capacitor is connected to the other electrode of the second capacitor, and a boost signal is input to a gate terminal of each of the first transistor and the second transistor, the first insulation element outputs the first electrical signal based on a voltage of the one electrode of the third capacitor and a voltage of the other electrode of the third capacitor, and the first modulation circuit generates the boost signal of the first logic level until a seventh time elapses after the first input signal transitions from an inverse logic level of the first logic level to the first logic level, and generates the boost signal of the inverse logic level of the first logic level in a period when the first modulated signal is not output.

Supplementary Note 10

The communication device of any one of Supplementary Notes 1 to 8, wherein
the first substrate further includes a first transmitting circuit connected between the first modulation circuit and the first insulation element,
the first transmitting circuit includes a first capacitor, a second capacitor, a third capacitor, a first inverter circuit to which the first modulated signal is input and which has an output terminal electrically connected to one electrode of the first capacitor, a second inverter circuit to which an inverted signal of the second modulated signal is input and which has an output terminal electrically connected to one electrode of the second capacitor, and a third transistor,
one electrode of the third capacitor is connected to the other electrode of the first capacitor, and the other electrode of the third capacitor is connected to the other electrode of the second capacitor,
the first insulation element outputs the first electrical signal based on a voltage of the one electrode of the third capacitor and a voltage of the other electrode of the third capacitor,
one terminal of the third transistor is connected to the other electrode of the first capacitor, the other terminal of the third transistor is connected to the other electrode of the second capacitor, and a shunt signal is input to a gate terminal of the third transistor, and
the first modulation circuit generates the shunt signal of the second logic level in a period when the first modulated signal is output, and if the output of the first modulated signal is completed, makes the shunt signal transition from the second logic level to the first logic level.

Supplementary Note 11

The communication device of any one of Supplementary Notes 1 to 10, wherein
the first receive circuit includes an amplifier circuit and a full-wave rectifier circuit,
the amplifier circuit amplifies the first electrical signal using a differential amplifier circuit, and outputs the first electrical signal to the full-wave rectifier circuit, and
the full-wave rectifier circuit performs full-wave rectification and envelope detection for an output of the amplifier circuit using the differential amplifier circuit and a current mirror circuit, and outputs, to the first output circuit, the signal as the first electrical signal demodulated by the first receive circuit.

Supplementary Note 12

The communication device of Supplementary Note 11, wherein
the amplifier circuit adds an offset voltage to an output signal to the full-wave rectifier circuit.

Supplementary Note 13

The communication device of any one of Supplementary Notes 1 to 12, further comprising
N (N is an integer of not less than 2) insulation elements including the first insulation element,
wherein the first substrate includes N modulation circuits including the first modulation circuit,
the second substrate includes N receive circuits including the first receive circuit, and N output circuits including the first output circuit,
a kth (k is an integer of 2 (inclusive) to N (inclusive)) input signal is transmitted by a kth modulation circuit, a kth insulation element, a kth receive circuit, and a kth output circuit and output as a kth output signal to the outside, and
if at least one of the first input signal to the Nth input signal has the first logic level, the oscillator supplies the carrier signal to each of the first modulation circuit to the Nth modulation circuit, and if all of the first input signal to the Nth input signal have an inverse logic level of the first logic level, the oscillator stops the supply of the carrier signal to each of the first modulation circuit to the Nth modulation circuit.

Supplementary Note 14

The communication device of Supplementary Note 13, wherein
a phase of the carrier signal supplied to the first modulation circuit and a phase of the carrier signal supplied to the kth modulation circuit are different.

Supplementary Note 15

The communication device of any one of Supplementary Notes 1 to 14, wherein
the first insulation element is one of an insulating capacitor and an isolation transformer.

Supplementary Note 16

The communication device of any one of Supplementary Notes 3, 4, and 7, wherein
the at least one delay circuit includes a third inverter circuit configured to receive an input signal, a first delay element configured to delay an output signal of the third inverter circuit and output the signal, and a fifth logic circuit configured to output a result of a NOR operation between the output signal of the third inverter circuit and an output signal of the first delay element.

Supplementary Note 17

The communication device of Supplementary Note 6 or 7, wherein
the at least one delay circuit includes a fourth inverter circuit configured to receive an input signal, a second delay element configured to delay an output signal of the fourth inverter circuit and output the signal, and a sixth logic circuit configured to output a result of a NAND operation between the output signal of the fourth inverter circuit and an output signal of the second delay element.

Supplementary Note 18

The communication device of any one of Supplementary Notes 1 to 17, wherein
the oscillator includes a ring oscillator.

Supplementary Note 19

The communication device of any one of Supplementary Notes 1 to 18, wherein
the first insulation element is provided on one of the first substrate and the second substrate or on both the first substrate and the second substrate.

Supplementary Note 20

The communication device of any one of Supplementary Notes 1 to 19, further comprising
a third substrate electrically connected to one of the first substrate and the second substrate,
wherein the first insulation element is provided on the third substrate.

Supplementary Note 21

The communication device of any one of Supplementary Notes 1 to 20, wherein
the first modulation circuit outputs a negative phase signal having an inverse logic level of the first modulated signal, and the first electrical signal corresponds to a signal obtained by transmitting, via the first insulation element, a differential signal based on the first modulated signal and the negative phase signal.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A communication device comprising:
a first substrate including a first input circuit, an oscillator and a first modulation circuit;
a second substrate insulated from the first substrate and including a first receive circuit and a first output circuit; and
a first insulation element connected between the first modulation circuit and the first receive circuit,
wherein
the first input circuit outputs a first input signal based on a data signal input from an external device,
the oscillator outputs a carrier signal in a high frequency band,
the first modulation circuit includes at least one delay circuit, outputs a first modulated signal based on the carrier signal if the first input signal has a first logic level, and using the at least one delay circuit, adjusts a length of a period to output the first modulated signal to be shorter or longer than a period when the first input signal has the first logic level,
the first receive circuit receives a first electrical signal based on the first modulated signal via the first insulation element and demodulates the first electrical signal,
the first output circuit outputs, to the outside, a first output signal based on the first electrical signal demodulated by the first receive circuit, and
a length of a period when the first output signal has the first logic level equals a length of the period when the first input signal has the first logic level.

2. The device of claim 1, wherein
the first modulation circuit includes a first logic circuit, and the at least one delay circuit includes a first delay circuit to which a signal based on the first input signal is input,
if the input signal transitions from a second logic level to the first logic level, an output signal of the first delay circuit is delayed by a first time and then transitions from the second logic level to the first logic level,
if the input signal transitions from the first logic level to the second logic level, the output signal of the first delay circuit immediately transitions from the first logic level to the second logic level, and
the first logic circuit outputs the first modulated signal based on the output signal of the first delay circuit and the carrier signal.

3. The device of claim 1, wherein
the first modulation circuit includes a first logic circuit, and the at least one delay circuit includes a first delay circuit and a third second delay circuit, to which a signal based on the first input signal is input,
if the input signal transitions from a second logic level to the first logic level, an output signal of the first delay circuit is delayed by a first time and then transitions from the second logic level to the first logic level,
if the input signal transitions from the first logic level to the second logic level, the output signal of the first delay circuit immediately transitions from the first logic level to the second logic level,
if the input signal transitions from the second logic level to the first logic level, an output signal of the second delay circuit is delayed by a second time and then transitions from the second logic level to the first logic level,
if the input signal transitions from the first logic level to the second logic level, the output signal of the second delay circuit immediately transitions from the first logic level to the second logic level, the first logic circuit outputs the first modulated signal based on the signal based on the first input signal and a signal based on the carrier signal, and before the first modulated signal is output, the first modulation circuit outputs a signal of the first logic level having a period based on a difference between the first time and the second time.

4. The device of claim 1, wherein the first modulation circuit includes a first logic circuit, and the at least one delay circuit includes a first delay circuit to which a signal based on the first input signal is input, if the input signal transitions from a second logic level to the first logic level, an output signal of the first delay circuit immediately transitions from the second logic level to the first logic level, if the input signal transitions from the first logic level to the second logic level, the output signal of the first delay circuit is delayed by a first time and then transitions from the first logic level to the second logic level, and the first logic circuit outputs the first modulated signal based on the output signal of the first delay circuit and the carrier signal.

5. The device of claim 1, wherein the first modulation circuit includes a first logic circuit, and the at least one delay circuit includes a first delay circuit and a second delay circuit, to which a signal based on the first input signal is input, if the input signal transitions from a second logic level to the first logic level, an output signal of the first delay circuit is delayed by a first time and then transitions from the second logic level to the first logic level, if the input signal transitions from the first logic level to the second logic level, the output signal of the first delay circuit immediately transitions from the first logic level to the second logic level, if the input signal transitions from the second logic level to the first logic level, an output signal of the second delay circuit immediately transitions from the second logic level to the first logic level, if the input signal transitions from the first logic level to the second logic level, the output signal of the second delay circuit is delayed by a sixth time and then transitions from the first logic level to the second logic level, the first logic circuit outputs the first modulated signal based on the output signal of the second delay circuit and a signal based on the carrier signal, and before the first modulated signal is output, the first modulation circuit outputs a signal of the first logic level having a period based on the first time.

6. The device of claim 1, wherein the first substrate further includes a first transmitting circuit connected between the first modulation circuit and the first insulation element, the first transmitting circuit includes a first inverter, a second inverter, a first capacitor, a second capacitor, and a third capacitor, the first modulated signal is input to the first inverter, an inverted signal of the first modulated signal is input to the second inverter, the transmitting circuit is configured to control a first resistance value between an output terminal of the first inverter and one electrode of the first capacitor, and a second resistance value between an output terminal of the second inverter and one electrode of the second capacitor based on a boost signal, one electrode of the third capacitor is connected to the other electrode of the first capacitor, the other electrode of the third capacitor is connected to the other electrode of the second capacitor, the first insulation element outputs the first electrical signal based on a voltage of the one electrode of the third capacitor and a voltage of the other electrode of the third capacitor, and the first modulation circuit generates the boost signal of the first logic level until a first time elapses after the first input signal transitions from an inverse logic level of the first logic level to the first logic level, and generates the boost signal of the inverse logic level of the first logic level in a period when the first modulated signal is not output.

7. The device of claim 1, wherein the first substrate further includes a first transmitting circuit connected between the first modulation circuit and the first insulation element, the first transmitting circuit includes a first inverter, a second inverter, a first capacitor, a second capacitor, a third capacitor, and a shunt circuit, the first modulated signal is input to the first inverter, an output terminal of the first inverter electrically connected to one electrode of the first capacitor, an inverted signal of the first modulated signal is input to the second inverter, an output terminal of the second inverter electrically connected to one electrode of the second capacitor, one electrode of the third capacitor is connected to the other electrode of the first capacitor, and the other electrode of the third capacitor is connected to the other electrode of the second capacitor, the first insulation element outputs the first electrical signal based on a voltage of the one electrode of the third capacitor and a voltage of the other electrode of the third capacitor, the shunt circuit is configured to shunt the third capacitor in a period when the first input signal has the first logic level.

8. The device of claim 1, wherein the first receive circuit includes an amplifier circuit and a full-wave rectifier circuit, the amplifier circuit amplifies the first electrical signal using a differential amplifier circuit, outputs the amplified first electrical signal to the full-wave rectifier circuit, and adds an offset voltage to an output signal of the full-wave rectifier circuit, and the full-wave rectifier circuit performs full-wave rectification and envelope detection for an output of the amplifier circuit using the differential amplifier circuit and a current mirror circuit, and outputs, to the first output circuit, the signal as the first electrical signal demodulated by the first receive circuit.

9. The device of claim 1, further comprising

N (N is an integer of not less than 2) insulation elements including the first insulation element, wherein the first substrate includes N input circuits including the first input circuit, and N modulation circuits including the first modulation circuit, the second substrate includes N receive circuits including the first receive circuit, and N output circuits including the first output circuit, the N input circuit output N input signal based on N data signals input from the external device, the N input signals are transmitted by the N modulation circuits, the N insulation elements, the N receive circuits, and the N output circuits and output as N output signals to the outside, and if at least one of the first input signal to the Nth input signal has the first logic level, the oscillator supplies the carrier signal to each of the first modulation circuit to the Nth modulation circuit, and if all of the first input signal to the Nth input signal have an inverse logic level of the first logic level, the oscillator stops the supply of the carrier signal to each of the first modulation circuit to the Nth modulation circuit.

10. The device of claim 9, wherein a phase of the carrier signal supplied to at least one modulation circuit included in the N modulation circuit is different from other modulation circuit.

11. The device of claim 1, wherein the first insulation element is provided on one of the first substrate and the second substrate or on both the first substrate and the second substrate.

12. The device of claim 1, further comprising a third substrate electrically connected to one of the first substrate and the second substrate, wherein the first insulation element is provided on the third substrate.

* * * * *